US008338257B2

(12) United States Patent
Yamazaki

(10) Patent No.: US 8,338,257 B2
(45) Date of Patent: Dec. 25, 2012

(54) NONVOLATILE SEMICONDUCTOR STORAGE DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

(21) Appl. No.: 12/718,011

(22) Filed: Mar. 5, 2010

(65) Prior Publication Data
US 2010/0159661 A1 Jun. 24, 2010

Related U.S. Application Data

(62) Division of application No. 11/702,201, filed on Feb. 5, 2007, now Pat. No. 7,723,773.

(30) Foreign Application Priority Data

Feb. 10, 2006 (JP) .................................. 2006-034543

(51) Int. Cl.
H01L 21/336 (2006.01)
(52) U.S. Cl. ........ 438/279; 438/283; 438/305; 438/308; 257/E21.423; 257/E21.679
(58) Field of Classification Search .................. 438/279, 438/283, 287, 305, 306, 308
See application file for complete search history.

(56) References Cited

U.S. PATENT DOCUMENTS

| 3,878,549 A | 4/1975 | Yamazaki et al. |
| 5,448,513 A | 9/1995 | Hu et al. |
| 5,808,336 A | 9/1998 | Miyawaki |
| 6,090,666 A | 7/2000 | Ueda et al. |
| 6,287,988 B1 | 9/2001 | Nagamine et al. |
| 6,310,376 B1 | 10/2001 | Ueda et al. |
| 6,324,101 B1 | 11/2001 | Miyawaki |
| 6,384,448 B1 | 5/2002 | Forbes |
| 6,388,291 B1 | 5/2002 | Zhang et al. |

(Continued)

FOREIGN PATENT DOCUMENTS

CN 1555096 12/2004

(Continued)

OTHER PUBLICATIONS

European Search Report (Application No. 07001473.3) Dated Nov. 24, 2010.

(Continued)

Primary Examiner — Hsien Ming Lee
(74) Attorney, Agent, or Firm — Eric J. Robinson; Robinson Intellectual Property Law Office, P.C.

(57) ABSTRACT

An object of the present invention is to provide a nonvolatile semiconductor storage device with a superior charge holding characteristic in which highly-efficient writing is possible at low voltage, and to provide a manufacturing method thereof. The nonvolatile semiconductor storage device includes a semiconductor film having a pair of impurity regions formed apart from each other and a channel formation region provided between the impurity regions; and a first insulating film, a charge accumulating layer, a second insulating film, and a conductive film functioning as a gate electrode layer which are provided over the channel formation region. In the nonvolatile semiconductor storage device, a second barrier formed by the first insulating film against a charge of the charge accumulating layer is higher in energy than a first barrier formed by the first insulating film against a charge of the semiconductor film.

16 Claims, 16 Drawing Sheets

U.S. PATENT DOCUMENTS

| | | |
|---|---|---|
| 6,417,538 B1 | 7/2002 | Choi |
| 6,498,369 B1 | 12/2002 | Yamazaki et al. |
| 6,518,594 B1 | 2/2003 | Nakajima et al. |
| 6,551,948 B2 | 4/2003 | Ohmi et al. |
| 6,586,797 B2 | 7/2003 | Forbes et al. |
| 6,597,034 B2 | 7/2003 | Yamazaki et al. |
| 6,613,630 B2 | 9/2003 | Lee |
| 6,646,288 B2 | 11/2003 | Yamazaki et al. |
| 6,699,754 B2 | 3/2004 | Huang |
| 6,713,834 B2 | 3/2004 | Mori et al. |
| 6,756,640 B2 | 6/2004 | Yamazaki et al. |
| 6,774,059 B1 * | 8/2004 | Chuang et al. ............... 438/791 |
| 6,774,430 B2 | 8/2004 | Horiguchi et al. |
| 6,812,086 B2 | 11/2004 | Murthy et al. |
| 6,828,623 B1 | 12/2004 | Guo et al. |
| 6,861,689 B2 | 3/2005 | Burnett |
| 6,914,302 B2 | 7/2005 | Ohtani et al. |
| 6,943,403 B2 | 9/2005 | Park |
| 6,955,968 B2 | 10/2005 | Forbes et al. |
| 6,975,018 B2 | 12/2005 | Ohmi et al. |
| 7,071,512 B2 | 7/2006 | Nakagawa et al. |
| 7,098,147 B2 | 8/2006 | Nansei et al. |
| 7,098,504 B2 | 8/2006 | Kawashima et al. |
| 7,122,488 B2 * | 10/2006 | Joshi et al. ............... 438/788 |
| 7,189,624 B2 | 3/2007 | Ito |
| 7,245,010 B2 | 7/2007 | Powell et al. |
| 7,391,075 B2 | 6/2008 | Jeon et al. |
| 7,439,121 B2 | 10/2008 | Ohmi et al. |
| 7,465,677 B2 | 12/2008 | Isobe et al. |
| 7,482,651 B2 | 1/2009 | Bhattacharyya |
| 7,485,526 B2 | 2/2009 | Mouli et al. |
| 7,541,236 B2 | 6/2009 | Takahashi et al. |
| 7,554,854 B2 | 6/2009 | Osame et al. |
| 7,560,767 B2 | 7/2009 | Yasuda et al. |
| 7,718,484 B2 | 5/2010 | Ohmi et al. |
| 2002/0079533 A1 | 6/2002 | Horiguchi et al. |
| 2002/0093045 A1 | 7/2002 | Forbes |
| 2002/0094640 A1 | 7/2002 | Forbes |
| 2002/0113262 A1 | 8/2002 | Forbes |
| 2002/0185674 A1 * | 12/2002 | Kawashima et al. ......... 257/315 |
| 2003/0203574 A1 * | 10/2003 | Kim et al. ............... 438/264 |
| 2004/0058497 A1 * | 3/2004 | Chen et al. ............... 438/287 |
| 2005/0095786 A1 | 5/2005 | Chang et al. |
| 2005/0112820 A1 | 5/2005 | Chen et al. |
| 2005/0142769 A1 | 6/2005 | Kamata et al. |
| 2005/0194645 A1 | 9/2005 | Yamaguchi et al. |
| 2005/0263767 A1 | 12/2005 | Yamazaki et al. |
| 2005/0272266 A1 | 12/2005 | Ohmi et al. |
| 2006/0003531 A1 | 1/2006 | Chang et al. |
| 2006/0008995 A1 | 1/2006 | Takahashi et al. |
| 2006/0043463 A1 | 3/2006 | Liu et al. |
| 2006/0186458 A1 | 8/2006 | Forbes et al. |
| 2006/0252205 A1 | 11/2006 | Kawashima et al. |
| 2007/0200167 A1 | 8/2007 | Yamazaki |
| 2007/0221971 A1 | 9/2007 | Yamazaki et al. |
| 2007/0221985 A1 | 9/2007 | Yamazaki et al. |
| 2007/0228448 A1 | 10/2007 | Yamazaki et al. |
| 2007/0228449 A1 | 10/2007 | Takano et al. |
| 2007/0228452 A1 | 10/2007 | Asami |
| 2007/0228453 A1 | 10/2007 | Yamazaki et al. |
| 2007/0235793 A1 | 10/2007 | Yamazaki et al. |
| 2007/0235794 A1 | 10/2007 | Yamazaki et al. |
| 2008/0220573 A1 | 9/2008 | Takahashi et al. |
| 2008/0258264 A1 | 10/2008 | Kamata et al. |
| 2009/0194803 A1 | 8/2009 | Yamazaki et al. |
| 2009/0257283 A1 | 10/2009 | Osame et al. |

FOREIGN PATENT DOCUMENTS

| | | |
|---|---|---|
| EP | 0 682 370 | 9/2000 |
| EP | 1 045 447 | 10/2000 |
| EP | 1347506 A | 9/2003 |
| EP | 1347507 A | 9/2003 |
| EP | 1615266 A | 1/2006 |
| JP | 51-007036 | 3/1976 |
| JP | 52-023532 | 6/1977 |
| JP | 55-015869 | 4/1980 |
| JP | 03-119765 | 5/1991 |
| JP | 06-097454 | 4/1994 |
| JP | 06-244432 | 9/1994 |
| JP | 08-097307 | 4/1996 |
| JP | 2656986 | 9/1997 |
| JP | 10-135357 | 5/1998 |
| JP | 11-040682 | 2/1999 |
| JP | 11-111869 A | 4/1999 |
| JP | 2000-058685 | 2/2000 |
| JP | 2002-009179 A | 1/2002 |
| JP | 2002-261091 A | 9/2002 |
| JP | 2004-221448 | 8/2004 |
| JP | 2005-191293 A | 7/2005 |
| JP | 2005-347328 | 12/2005 |
| JP | 2006-114905 | 4/2006 |

OTHER PUBLICATIONS

European Search Report (Application No. 07001473.3) Dated Sep. 9, 2010.

Office Action (Application No. 200710005108.X) dated Nov. 27, 2009.

* cited by examiner 101  103a  102  103b

104

105

107

108

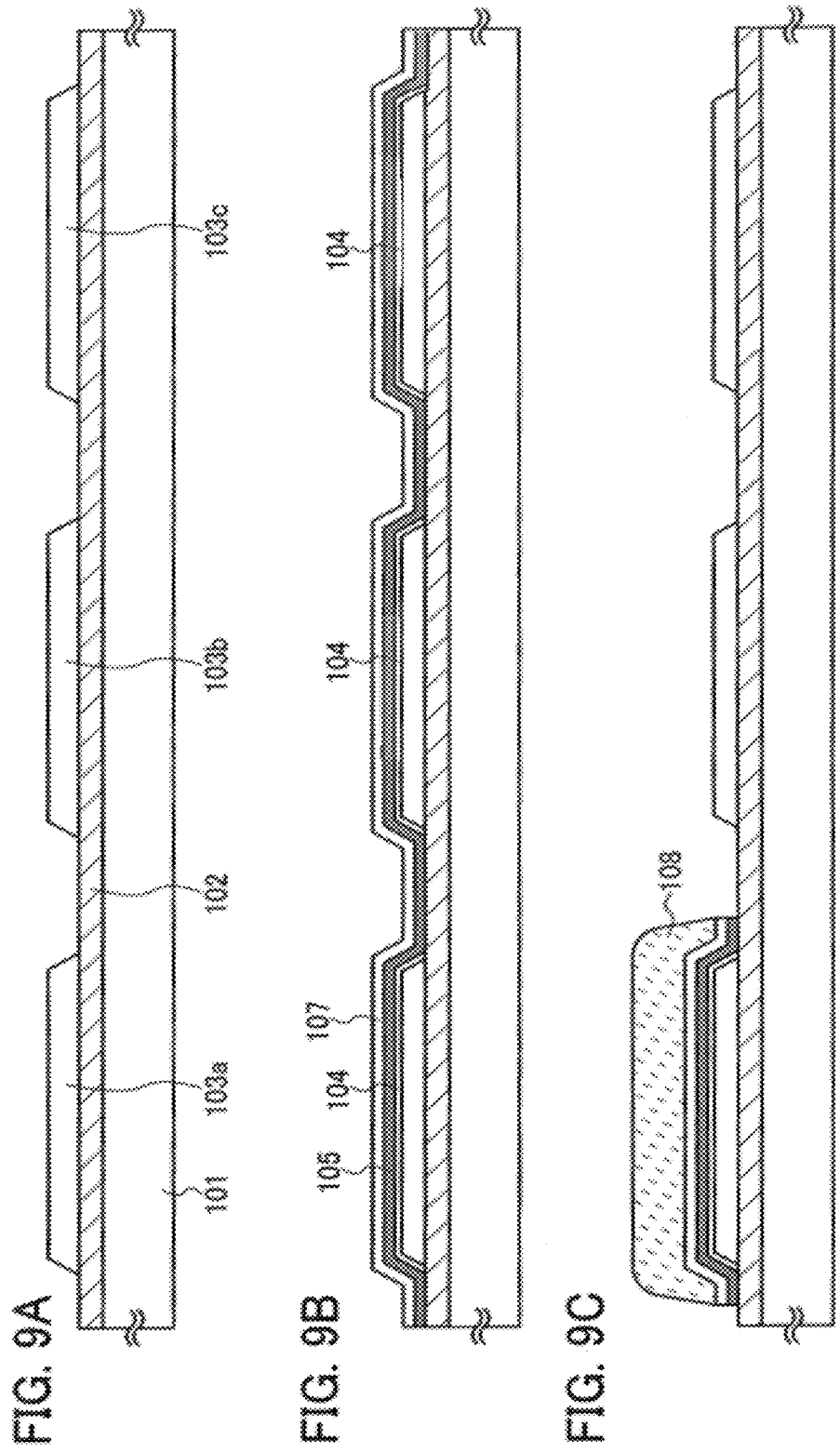

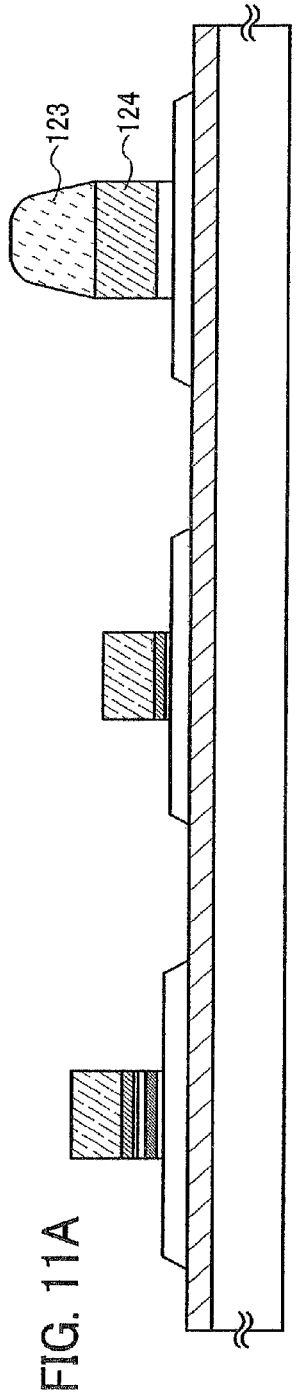
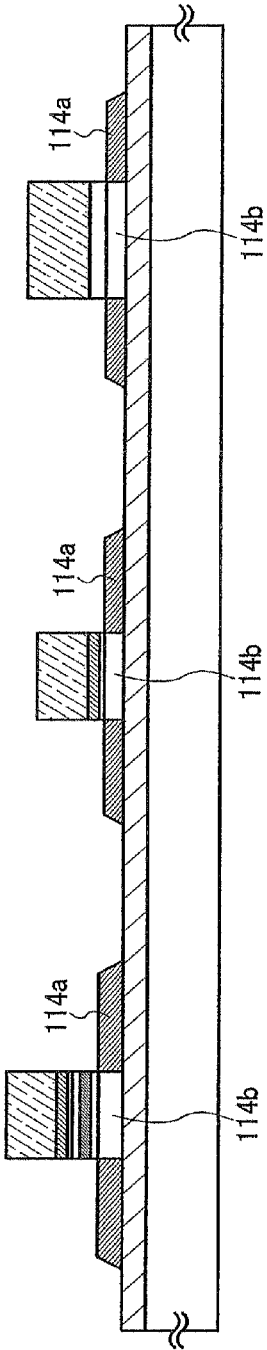
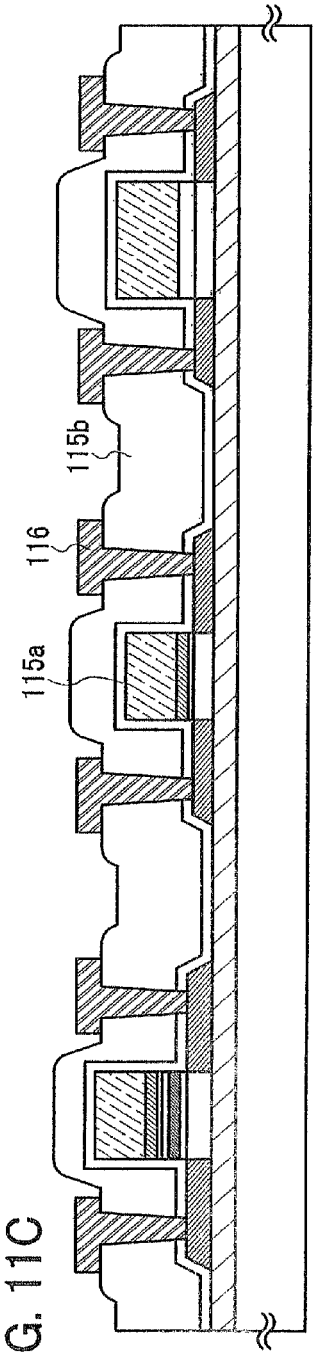

NONVOLATILE SEMICONDUCTOR STORAGE DEVICE AND MANUFACTURING METHOD THEREOF

BACKGROUND OF THE INVENTION

1. Field of the Invention

The present invention relates to a nonvolatile semiconductor storage device that is electrically writable, readable, and erasable, and its manufacturing method. In particular, the present invention relates to a structure of a charge accumulating layer in the nonvolatile semiconductor storage device.

2. Description of the Related Art

The market is expanding for nonvolatile memories as one kind of semiconductor memories, in which data can be electrically rewritten and data can be stored even after the power is turned off. Features of a nonvolatile memory lie in that its structure is similar to that of a MOS transistor and a region capable of accumulating charges for a long period of time is provided over a channel formation region. A floating gate type nonvolatile memory holds charges by injecting the charges in a floating gate through a tunnel insulating film over a channel formation region. In a MONOS (Metal-Oxide-Nitride-Oxide Semiconductor) type nonvolatile memory, a trap or a silicon cluster of a silicon nitride film is used as a charge holdback carrier.

FIG. 16 shows a typical structure of a nonvolatile memory. Over a semiconductor film 800 forming a channel formation region, a nonvolatile memory has a first insulating film 801 which is also called a tunnel insulating film, a charge accumulating layer 802 which is also called a floating gate, a second insulating film 803, a control gate electrode 804, a source 805, and a drain 806.

Such a nonvolatile memory can store one-bit data by one transistor. In a case of writing data, voltage is applied between the source 805 and the drain 806 and between the semiconductor film 800 and the control gate electrode 804 to inject charges from the semiconductor film 800 to the charge accumulating layer 802 through the first insulating film 801; then, the charges are accumulated in the charge accumulating layer 802 that is electrically insulated from its periphery. In a case of reading data, information can be read out by utilizing a characteristic that threshold voltage of a MOS transistor changes depending on whether there are charges in the charge accumulating layer 802. That is to say, the information of "0" and "1" can be stored and read. In a case of erasing data, on the contrary, high voltage is applied to the semiconductor film 800 or the source 805 so as to extract the charges from the charge accumulating layer 802 through the first insulating film 801.

The charges are injected in the charge accumulating layer 802 by increasing voltage applied between the semiconductor film 800 and the control gate electrode 804 and using hot electrons (NOR type) or Fowler-Nordheim type (F-N type) tunnel current (NAND type) flowing through the first insulating film 801 by an intense electric field. In the both types, a high electric field is applied between the semiconductor film 800 and the control gate electrode 804; therefore, the charges are injected in the insulating film that is formed to be thin.

The nonvolatile memory having the charge accumulating layer 802 is required to have a characteristic that can hold charges accumulated in the charge accumulating layer 802 for ten years or more in order to assure the reliability. Therefore, the first insulating film 801 and the second insulating film 803 are required to have a high insulating property so that the charges do not leak from the charge accumulating layer 802. A floating gate type nonvolatile memory has difficulty in thinning the first insulating film 801 so that F-N type tunnel current flows therethrough (7 to 8 nm thick in a case of a $SiO_2$ film) and it is difficult to reduce writing voltage and erasing voltage (10 to 20 V). In addition, a MONOS type nonvolatile memory is required to have a silicon nitride film with a comparatively large volume so that a trap or a silicon cluster in the silicon nitride film holds the charge and threshold voltage of a MOS transistor is changed. Thus, it is considered that element miniaturization and voltage reduction have limitation.

A nonvolatile memory in which the second insulating film 803 in FIG. 16 is formed by a plurality of insulating films and a deep trap level is provided at high concentration in order to reduce writing voltage and improve a charge holding characteristic is known (for example, Reference 1: Japanese Published Patent Application No. H11-40682). Moreover, a MONOS type nonvolatile memory in which a charge holding characteristic is improved by controlling hydrogen concentration of silicon nitride used for the charge accumulating layer 802 is known (for example, Reference 2: Japanese Published Patent Application No. 2004-221448).

SUMMARY OF THE INVENTION

Even though the second insulating film 803 and the charge accumulating layer 802 in FIG. 16 are improved, thinning the first insulating film 801 is necessary in order to maintain the charge holding characteristic. However, thinning the first insulating film 801 has limitation, causing a problem in that writing voltage cannot be reduced if the thickness of the insulating film 801 cannot be thinned. Moreover, improvement of only the charge holding characteristic of the charge accumulating layer 802 could not allow the reduction of writing voltage.

Further, it is difficult to use a thermal oxidation method in the formation of the insulating films when the nonvolatile semiconductor storage device is formed over a substrate having low heat resistance such as a glass substrate by using an element such as a thin film transistor. Therefore, in a case of forming the first insulating film 801 to be thin, it was necessary to form the insulating film with a thickness of several nanometers by a CVD method or a sputtering method. However, since the first insulating film 801 formed with a thickness of several nanometers by a CVD method or a sputtering method does not have enough film quality because of a defect inside the film, there are problems in that leak current is generated and the semiconductor film 800 and the charge accumulating layer 802 are short-circuited, or the like, resulting in that the reliability of the nonvolatile semiconductor storage device is lowered (a writing or reading defect).

In view of the aforementioned problems, it is an object of the present invention to provide a nonvolatile semiconductor storage device which is superior in a charge holding characteristic and in which highly-efficient writing is possible at low voltage, and its manufacturing method.

A nonvolatile semiconductor storage device of the present invention includes a semiconductor film having a pair of impurity regions formed apart from each other and a channel formation region provided between the pair of impurity regions; and a first insulating film, a charge accumulating layer, a second insulating film, and a conductive film functioning as a gate electrode layer which are provided over the channel formation region. In this nonvolatile semiconductor storage device, a second barrier formed by the first insulating film against a charge of the charge accumulating layer is higher in energy than a first barrier formed by the first insulating film against a charge of the semiconductor film.

A nonvolatile semiconductor storage device of the present invention includes a semiconductor film having a pair of impurity regions formed apart from each other and a channel formation region provided between the pair of impurity regions; and a first insulating film, a charge accumulating layer, a second insulating film, and a conductive film functioning as a gate electrode layer which are provided over the channel formation region. In this nonvolatile semiconductor storage device, the charge accumulating layer is formed of a material with a smaller energy gap (band gap) or higher electron affinity than the semiconductor film.

A method for manufacturing a nonvolatile semiconductor storage device of the present invention includes: forming a semiconductor film over a substrate; forming a first insulating film including one or both of oxygen and nitrogen on a surface of the semiconductor film by performing high-density plasma treatment; forming a charge accumulating layer including a material with a smaller energy gap or higher electron affinity than the semiconductor film, over the first insulating film; forming a second insulating film including nitrogen over the charge accumulating layer; forming a conductive film over the second insulating film; forming selectively a resist over the semiconductor film; removing selectively the first insulating film, the charge accumulating layer, the second insulating film, and the conductive film, thereby leaving the first insulating film, the charge accumulating layer, the second insulating film, and the conductive film so as to overlap with at least a part of the semiconductor film; and forming an impurity region in the semiconductor film by introducing an impurity element with a left part of the conductive film used as a mask.

A method for manufacturing a nonvolatile semiconductor storage device of the present invention includes: forming a semiconductor film over a substrate; forming a first insulating film including a stacked-layer film of an oxide film and a film including oxygen and nitrogen on a surface of the semiconductor film by performing first high-density plasma treatment under an oxygen atmosphere and then performing second high-density plasma treatment under a nitrogen atmosphere; forming a charge accumulating layer including a material with a smaller energy gap or higher electron affinity than the semiconductor film, over the first insulating film; forming a second insulating film including nitrogen over the charge accumulating layer; oxidizing a surface of the second insulating film including nitrogen by performing third high-density plasma treatment under an oxygen atmosphere; forming a conductive film over the second insulating film of which surface has been oxidized; removing selectively the first insulating film, the charge accumulating layer, the second insulating film, and the conductive film, thereby leaving the first insulating film, the charge accumulating layer, the second insulating film, and the conductive film so as to overlap with at least a part of the semiconductor film; and forming an impurity region in the semiconductor film by introducing an impurity element with a left part of the conductive film used as a mask.

A method for manufacturing a nonvolatile semiconductor storage device of the present invention includes: forming a first semiconductor film and a second semiconductor film over a substrate; forming a first insulating film on a surface of the first semiconductor film and a surface of the second semiconductor film by performing first high-density plasma treatment under an oxygen atmosphere and then performing second high-density plasma treatment under a nitrogen atmosphere; forming a charge accumulating layer including a material with a smaller energy gap or higher electron affinity than the first semiconductor film and the second semiconductor film, over the first insulating film; forming a second insulating film including nitrogen over the charge accumulating layer, removing selectively the first insulating film, the charge accumulating layer, and the second insulating film which are formed over the second semiconductor film so as to expose a surface of the second semiconductor film; oxidizing a surface of the second insulating film including nitrogen formed over the first semiconductor film and simultaneously forming a gate insulating film on the surface of the second semiconductor film, by performing third high-density plasma treatment under an oxygen atmosphere; forming a conductive film over the second insulating film of which surface has been oxidized and over the gate insulating film; removing selectively the first insulating film, the charge accumulating layer, the second insulating film, the gate insulating film, and the conductive film, thereby leaving the first insulating film, the charge accumulating layer, the second insulating film, and the conductive film so as to overlap with at least a part of the first semiconductor film and leaving the gate insulating film and the conductive film so as to overlap with at least a part of the second semiconductor film; and forming an impurity region in the first semiconductor film and the second semiconductor film by introducing an impurity element with a left part of the conductive film used as a mask.

In the nonvolatile semiconductor storage device of the present invention, the semiconductor film may be formed over a substrate having an insulating surface. Also, in the nonvolatile semiconductor storage device of the present invention, the pair of the impurity regions and the channel formation region may be formed in a single crystal silicon substrate.

It is to be noted that the high-density plasma treatment means plasma treatment performed under conditions where high frequency is used, electron density ranges from $1\times10^{11}$ cm$^{-3}$ to $1\times10^{13}$ cm$^{-3}$, and electron temperature ranges from 0.5 eV to 1.5 eV.

In a case of forming the charge accumulating layer over the semiconductor film with an insulating film functioning as a tunnel oxide film interposed therebetween, charge injection from the semiconductor film to the charge accumulating layer can be made easier and charge disappearance from the charge accumulating layer can be prevented by having a structure in which a second barrier formed by the insulating film against a charge of the charge accumulating layer is higher in energy than a first barrier formed by the insulating film against a charge of the semiconductor film.

In the case of forming the charge accumulating layer over the semiconductor film with the insulating film functioning as a tunnel oxide film interposed therebetween, charge injection from the semiconductor film to the charge accumulating layer can be made easier and charge disappearance from the charge accumulating layer can be prevented by forming the charge accumulating layer using a material with a smaller energy gap or higher electron affinity than a material used for the semiconductor film. Accordingly, it becomes possible to manufacture a nonvolatile semiconductor storage device which enables highly-efficient writing at low voltage and which is superior in a charge holding characteristic and has high reliability.

BRIEF DESCRIPTION OF DRAWINGS

In the accompanying drawings:

FIGS. 9A to 9C show an example of a manufacturing method of a nonvolatile semiconductor storage device of the present invention;

FIGS. 11A to 11C show an example of a manufacturing method of a nonvolatile semiconductor storage device of the present invention;

DETAILED DESCRIPTION OF THE INVENTION

Figure 1A:
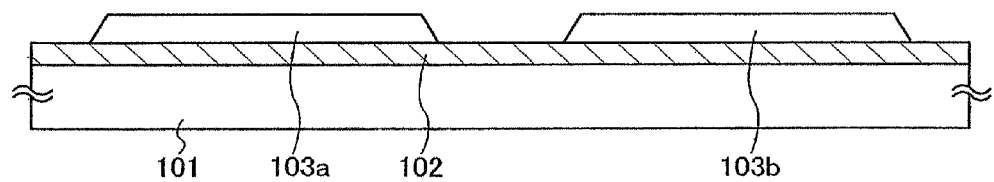
FIGS. 1A to 1E show an example of a manufacturing method of a nonvolatile semiconductor storage device of the present invention.

Embodiment modes of the present invention are hereinafter described with reference to drawings. However, it is easily understood by those skilled in the art that the present invention is not limited by the following description and that the mode and detail can be variously changed without departing from the scope and spirit of the present invention. Therefore, the present invention is not construed as being limited to the description of the embodiment modes hereinafter shown. In the structure of the present invention described below, a reference numeral denoting the same part may be used in common throughout the drawings.

(Embodiment Mode 1)

Embodiment Mode 1 will explain an example of a nonvolatile semiconductor storage device with reference to drawings. It is to be noted that a case is shown here in which a storage element included in a memory portion of a nonvolatile semiconductor storage device is formed at the same time as an element such as a transistor included in a logic portion that is formed over the same substrate as the memory portion and that carries out control and the like of writing and reading of the storage element.

First, island-shaped semiconductor films 103a and 103b are formed over a substrate 101 with an insulating film 102 interposed therebetween (FIG. 1A). The island-shaped semiconductor films 103a and 103b can be provided in such a way that (1) an amorphous semiconductor film is formed of a material containing silicon (Si) as its main component (for example, $Si_xGe_{1-x}$ or the like) by a sputtering method, an LPCVD method, a plasma CVD method, or the like over the insulating film 102 formed in advance over the substrate 101; (2) the amorphous semiconductor film is crystallized; and then (3) the crystallized semiconductor film is selectively etched. It is to be noted that the amorphous semiconductor film can be crystallized by a laser crystallization method, a thermal crystallization method using RTA or an annealing furnace, a thermal crystallization method using a metal element promoting crystallization, a method in which these are combined, or the like.

As the substrate 101, a glass substrate, a quartz substrate, a metal substrate (such as a stainless steel substrate), a ceramic substrate, or a semiconductor substrate such as a Si substrate can be used. In addition, as a plastic substrate, a substrate formed of polyethylene terephthalate (PET), polyethylene naphthalate (PEN), polyether sulfone (PES), acrylic, or the like can be used.

The insulating film 102 is formed of an insulating material such as silicon oxide ($SiO_x$), silicon nitride ($SiN_x$), silicon oxynitride ($SiO_xN_y$, x>y>0), or silicon nitride oxide ($SiN_xO_y$, x>y>0), by CVD method, spattering method or the like. For example, in a case where the insulating film 102 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. By forming the insulating film 102 functioning as a blocking layer in this manner, it is possible to prevent alkaline earth metal or alkali metal such as Na in the substrate 101 from adversely affecting an element to be formed over the insulating film 102. In a case of using quartz for the substrate 101, the insulating film 102 may be omitted.

Figure 1B:
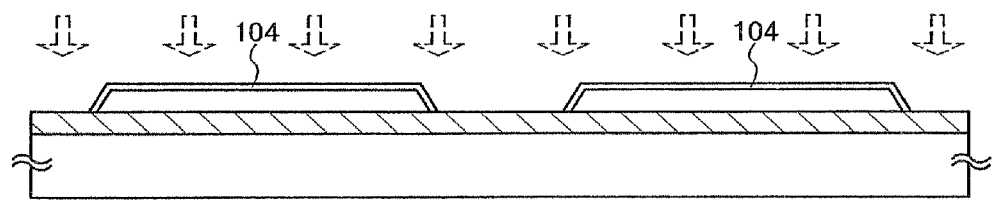

Next, oxidation treatment, nitridation treatment, or oxynitridation treatment is performed on the semiconductor films 103a and 103b by high-density plasma treatment, thereby forming a first insulating film 104 which becomes an oxide film, a nitride film, or a film including oxygen and nitrogen on surfaces of the semiconductor films 103a and 103b (the first insulating film 104 is hereinafter referred to as the insulating film 104) (FIG. 1B).

For example, in a case of performing oxidation treatment or nitridation treatment when the semiconductor films 103a and 103b each contain silicon as its main component, a silicon oxide film or a silicon nitride film is formed as the insulating film 104. Moreover, after performing oxidation treatment on the semiconductor films 103a and 103b by high-density plasma treatment, nitridation treatment may be performed by conducting high-density plasma treatment again. In the latter case, a silicon oxide film is formed in contact with the semiconductor films 103a and 103b and a film including oxygen and nitrogen is formed over the silicon oxide film, thereby forming a stack of the silicon oxide film and the film including oxygen and nitrogen as the insulating film 104.

Here, the insulating film 104 is formed with a thickness of 1 to 10 nm, preferably 1 to 5 nm. For example, after forming a silicon oxide film with a thickness of about 5 nm on surfaces of the semiconductor films 103a and 103b by performing oxidation treatment on the semiconductor films 103a and 103b by high-density plasma treatment, a film including oxygen and nitrogen with a thickness of about 2 nm is formed on a surface of the silicon oxide film by high-density plasma treatment. In this case, the silicon oxide film formed on the surfaces of the semiconductor films 103a and 103b has a thickness of about 3 nm. This is because the thickness of the silicon oxide film is reduced from the thickness of the formed film including oxygen and nitrogen. Moreover, at this time, the oxidation treatment and the nitridation treatment by high-density plasma treatment are preferably performed continuously without exposure to the air. By continuously performing the high-density plasma treatment, prevention of impurity mixture and improvement of production efficiency can be achieved.

In a case of oxidizing the semiconductor films by high-density plasma treatment, the treatment is performed under an oxygen atmosphere. As the oxygen atmosphere, for example, an atmosphere including oxygen ($O_2$) and a noble gas; an atmosphere including dinitrogen monoxide ($N_2O$) and a noble gas; an atmosphere including oxygen, hydrogen ($H_2$), and a noble gas; or an atmosphere including dinitrogen monoxide, hydrogen ($H_2$), and a noble gas is given. As the noble gas, at least one of He, Ne, Ar, Kr, and Xe is included. On the other hand, in a case of nitriding the semiconductor films by high-density plasma treatment, the treatment is performed under a nitrogen atmosphere. As the nitrogen atmosphere, for example, an atmosphere including nitrogen ($N_2$) and a noble gas; an atmosphere including nitrogen, hydrogen, and a noble gas; or an atmosphere including $NH_3$ and a noble gas is given. As the noble gas, at least one of He, Ne, Ar, Kr, and Xe is included.

As the noble gas, for example, Ar can be used. Alternatively, a gas in which Ar and Kr are mixed may be used. In a case of performing high-density plasma treatment in a noble gas atmosphere, the insulating film 104 may include the noble gas (at least one of He, Ne, Ar, Kr, and Xe) used for the plasma treatment. When Ar is used, the insulating film 104 may include Ar.

Moreover, the high-density plasma treatment is performed in an atmosphere including the aforementioned gas with an electron density of $1 \times 10^{11}$ cm$^{-3}$ or more and plasma electron temperature of 1.5 eV or less. More specifically, the electron density ranges from $1 \times 10^{11}$ cm$^{-3}$ to $1 \times 10^{13}$ cm$^{-3}$ and the plasma electron temperature ranges from 0.5 eV to 1.5 eV. Since the plasma electron density is high and the electron temperature in the vicinity of an object to be processed that is formed over the substrate 101 (here, the semiconductor films 103a and 103b) is low, plasma damage on the object to be processed can be prevented. Moreover, since the plasma electron density is as high as $1 \times 10^{11}$ cm$^{-3}$ or more, an oxide film or a nitride film formed by oxidizing or nitriding the object to be processed by using the plasma treatment can be dense and superior in uniformity of its film thickness and the like as compared with a film formed by a CVD method, a sputtering method, or the like. Furthermore, since the plasma electron temperature is as low as 1.5 eV or less, oxidation treatment or nitridation treatment can be performed at lower temperature than in conventional plasma treatment or thermal oxidation method. For example, even plasma treatment at temperatures lower than the distortion point of a glass substrate by 100° C. or more can sufficiently perform oxidation treatment or nitridation treatment. As the frequency for forming plasma, high frequency such as a microwave (for example, 2.45 GHz) can be used.

In this embodiment mode, the insulating film 104 formed over the semiconductor film 103a in the memory portion will function as a tunnel oxide film in a storage element to be completed later. Therefore, the thinner the insulating film 104 is, the more easily the tunnel current flows, which allows a higher-speed operation as a memory. Further, when the insulating film 104 is thinner, charges can be accumulated at lower voltage in a charge accumulating layer to be formed later; therefore, the power consumption of the semiconductor device can be reduced. Accordingly, the insulating film 104 is preferably formed to be thin.

In general, a thermal oxidation method is given as a method for forming a thin insulating film over a semiconductor film. However, when a storage element is provided over a substrate of which melting point is not sufficiently high, such as a glass substrate, it is very difficult to form the insulating film 104 by a thermal oxidation method. Moreover, an insulating film formed by a CVD method or a sputtering method does not have enough film quality because of a defect inside the film, causing a problem in that a defect such as a pinhole is produced when the film is formed to be thin. In addition, an insulating film formed by a CVD method or a sputtering method does not cover an end portion of the semiconductor film sufficiently, resulting in that a conductive film and the like to be later formed over the insulating film 104 and the semiconductor film may be in contact with each other to cause leakage. Thus, when the insulating film 104 is formed by the high-density plasma treatment as shown in this embodiment mode, the insulating film 104 can be denser than an insulating film formed by a CVD method, a sputtering method, or the like, and moreover the insulating film 104 can cover an end portion of the semiconductor film sufficiently. As a result, the operation speed as a memory can be increased and the power consumption of the semiconductor device can be reduced.

Figure 1C:
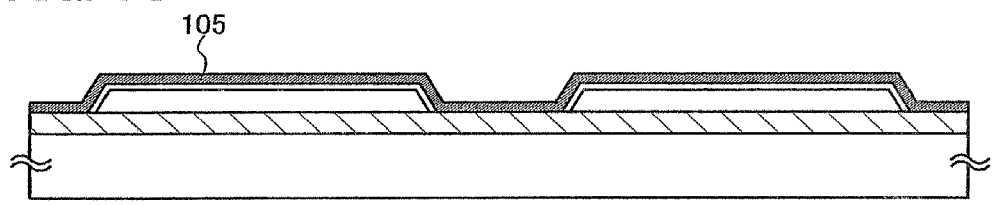

Next, a charge accumulating layer 105 is formed over the insulating film 104 (FIG. 1C). The charge accumulating layer 105 functions as a layer accumulating charges in a storage element to be completed later and may also be referred to as a floating gate in general. The charge accumulating layer 105 is preferably formed of a material with a smaller energy gap (band gap) than the material used for the semiconductor films 103a and 103b. For example, the charge accumulating layer 105 can be formed of germanium (Ge), a silicon-germanium alloy, or the like. In addition, the charge accumulating layer 105 can be formed by using another conductive film or semiconductor film as long as a material has a smaller energy gap (band gap) than the material used for the semiconductor films 103a and 103b. Furthermore, the charge accumulating layer 105 may be formed of a material with higher electron affinity than the material used for the semiconductor films 103a and 103b.

Here, the charge accumulating layer 105 is formed using a film containing germanium as its main component with a thickness of 1 to 20 nm, preferably 5 to 10 nm, in an atmosphere including a germanium element (for example, $GeH_4$) by a plasma CVD method. When the semiconductor film is formed of a material containing Si as its main component and the film including germanium with a smaller energy gap than Si is provided as the charge accumulating layer over the semiconductor film with the insulating film functioning as a tunnel oxide film interposed therebetween in this manner, a second barrier formed by the insulating film against a charge of the charge accumulating layer gets higher in energy than a first barrier formed by the insulating film against a charge of the semiconductor film. As a result, the charge can be easily injected from the semiconductor film to the charge accumulating layer, thereby preventing charge disappearance from the charge accumulating layer. That is to say, in a case of operating as a memory, highly-efficient writing is possible at low voltage and moreover, the charge holding characteristic can be improved.

Figure 1D:
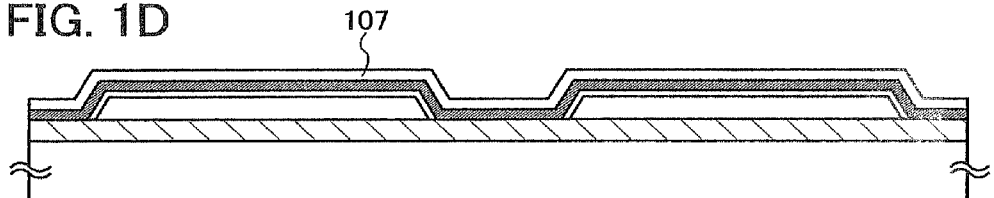

Next, a second insulating film 107 including a silicon oxynitride film, a silicon nitride film, a silicon nitride oxide film, or the like is formed over the charge accumulating layer 105 (FIG. 1D). The insulating film 107 can be formed by an LPCVD method, a plasma CVD method, or the like, and here the insulating film 107 is formed by a silicon nitride film or a silicon nitride oxide film with a thickness of 1 to 20 nm, preferably 5 to 10 nm, by a plasma CVD method. Alternatively, the charge accumulating layer 105 may be subjected to high-density plasma treatment to perform nitridation treatment so that a nitride film (for example, $GeN_x$ in a case of using a film containing germanium as its main component as the charge accumulating layer 105) is formed on a surface of the charge accumulating layer 105. In the latter case, the nitride film obtained by the nitridation treatment may be used as the insulating film 107 or the aforementioned insulating film may be separately formed as the insulating film 107 over the nitride film obtained by the nitridation treatment. In addition, the second insulating film 107 may be formed of aluminum oxide ($AlO_x$), hafnium oxide ($HfO_x$), or tantalum oxide ($TaO_x$).

In the aforementioned step, the charge accumulating layer 105 and the insulating film 107 are preferably formed continuously without exposure to the air. By continuously forming the charge accumulating layer 105 and the insulating film 107, prevention of impurity mixture and improvement of production efficiency can be achieved. For example, the charge accumulating layer 105 and the insulating film 107 are formed continuously without exposure to the air by using a plasma CVD method.

Figure 1E:
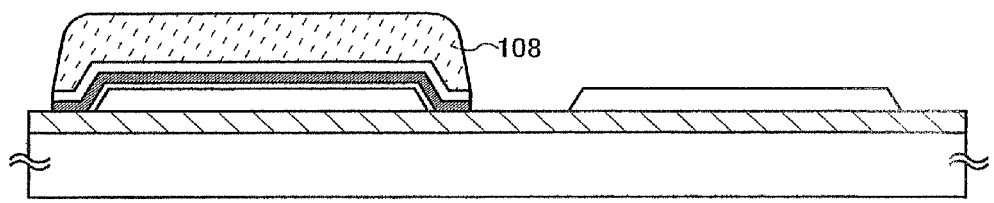

Next, after selectively forming a resist 108 so as to cover the element included in the memory portion, the insulating film 104, the charge accumulating layer 105, and the insulating film 107 which are formed over the element included in the logic portion are selectively removed (FIG. 1E). Here, after selectively forming the resist 108 so as to cover the insulating film 107 formed over the semiconductor film 103a, the insulating film 104, the charge accumulating layer 105, and the insulating film 107 which are formed over the semiconductor film 103b are selectively removed, thereby exposing the semiconductor film 103b.

Figure 2A:
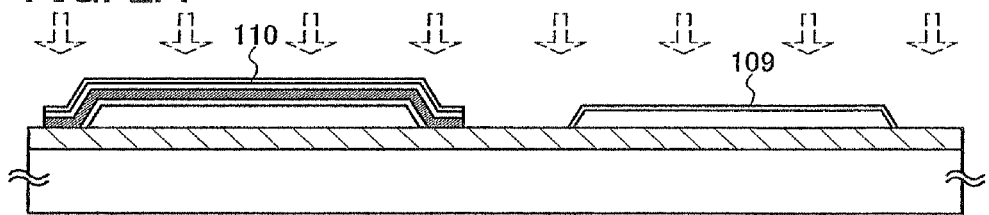
FIGS. 2A to 2E show an example of a manufacturing method of a nonvolatile semiconductor storage device of the present invention.

Next, oxidation treatment, nitridation treatment, or oxynitridation treatment is performed by high-density plasma treatment (FIG. 2A). As a result, an insulating film 110 is formed on a surface of the second insulating film 107 and an insulating film 109 is formed on a surface of the semiconductor film 103b. Here, the insulating film 110 having a film including oxygen and nitrogen (here, a silicon nitride oxide film or a silicon oxynitride film) is formed on the surface of the insulating film 107 by performing high-density plasma treatment under an oxygen atmosphere on the insulating film 107 formed by a silicon nitride film or a silicon nitride oxide film. At the same time, the insulating film 109 having a silicon oxide film is formed on the surface of the semiconductor film 103b. The insulating film 109 functions as a gate insulating film. The second insulating film 107 may be covered with a mask or the like so that the insulating film 110 is not formed. It is to be noted that the high-density plasma treatment may be performed by a condition and a method similar to those for the high-density plasma treatment performed on the semiconductor films 103a and 103b shown in FIG. 1B.

Moreover, in FIG. 2A, the insulating film 109 may be formed by a plasma CVD method or the like instead of the high-density plasma treatment. In this case, the insulating film may or may not be formed over the second insulating film 107.

Figure 2B:
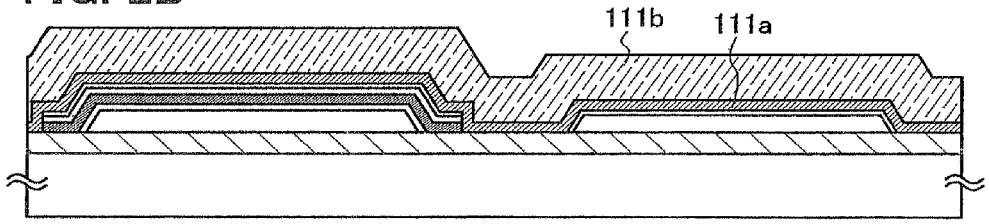

Subsequently, a conductive film is formed over the semiconductor films 103a and 103b (FIG. 2B). Here, an example is shown in which a stack of a conductive film 111a and a conductive film 111b is formed as the conductive film. Needless to say, the conductive film may have a single-layer structure or a stacked-layer structure including three or more layers.

The conductive films 111a and 111b can be formed of an element selected from tantalum (Ta), tungsten (W), titanium (Ti), molybdenum (Mo), aluminum (Al), copper (Cu), chromium (Cr), niobium (Nb), and the like or an alloy or compound material including any of these elements as its main component. Moreover, a semiconductor material typified by polycrystalline silicon doped with an impurity element such as phosphorus can be used. Here, the conductive film 111a is formed of tantalum nitride and the conductive film 111b is formed of tungsten over the conductive film 111a. In addition, the conductive film 111a can be formed of tungsten nitride, molybdenum nitride, or titanium nitride, and the conductive film 111b can be formed of tantalum, molybdenum, titanium, or the like. The conductive films 111a and 111b can be formed by combining these materials freely.

Figure 2C:
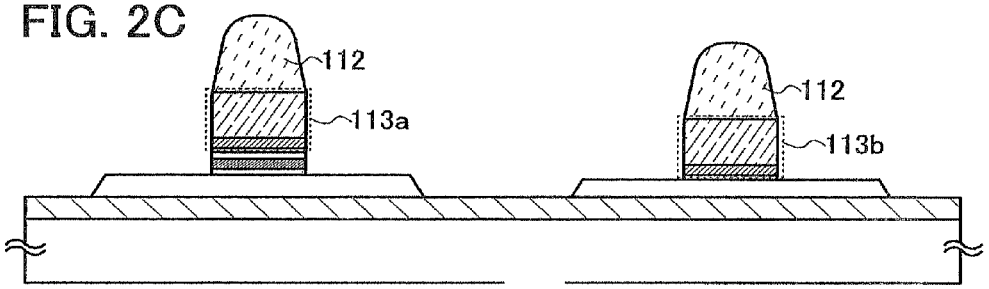

Next, a resist 112 is selectively formed over the conductive film 111b formed over the semiconductor films 103a and 103b. Then, the insulating film 104, the charge accumulating layer 105, the insulating film 107, the insulating film 110, and the conductive films 111a and 111b which are provided over the semiconductor film 103a, and the insulating film 109 and the conductive films 111a and 111b which are provided over the semiconductor film 103b are selectively removed by using the resist 112 as a mask (FIG. 2C).

Figure 2D:
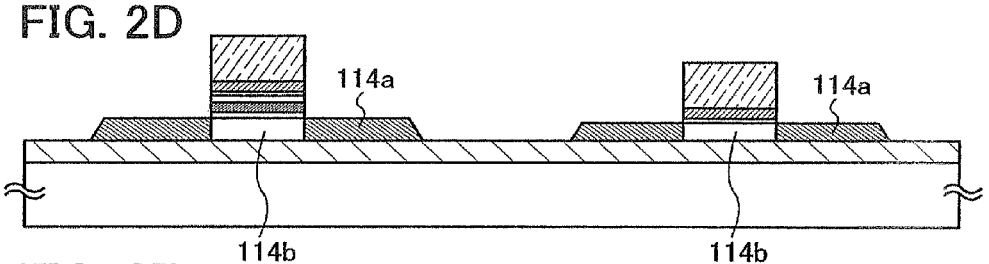

Next, an impurity element is introduced in the semiconductor film 103a and the semiconductor film 103b; thus, impurity regions 114a which can function as source or drain regions are formed in the semiconductor film 103a and the semiconductor film 103b and channel formation regions 114b are each formed between the impurity regions 114a that are provided apart from each other (FIG. 2D). The impurity regions 114a and the channel formation regions 114b can be formed in a self-aligning manner by using conductive films 113a and 113b functioning as gate electrodes as a mask when the impurity element is introduced in the semiconductor films 103a and 103b.

Figure 2E:
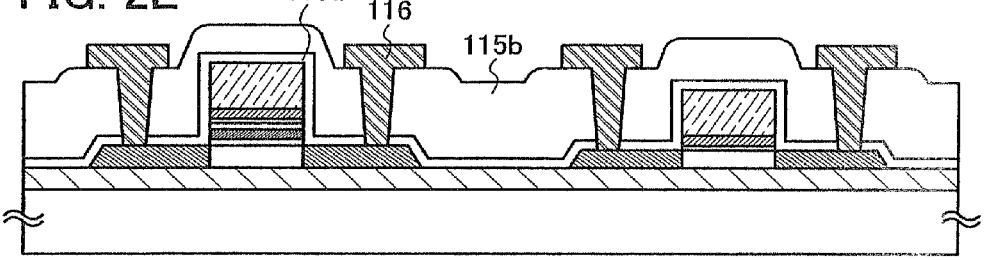

Next, an insulating film is formed over the semiconductor films 103a and 103b and the conductive films 113a and 113b (FIG. 2E). Here, the insulating film is formed by stacking an insulating film 115a and an insulating film 115b. Alternatively, the insulating film may have a single-layer structure or a stacked-layer structure including three or more layers. After that, contact holes are selectively formed in the insulating films 115a and 115b to expose the semiconductor films 103a and 103b, and then a conductive film 116 is selectively formed so as to fill the contact holes. The conductive film 116 is electrically connected to the impurity regions 114a of the semiconductor films 103a and 103b.

By these steps, a nonvolatile semiconductor storage device having a logic portion and a storage element portion having a storage element can be manufactured. In the manufacturing method shown in FIGS. 1A to 2E, the insulating film 104 and the insulating film 109 can be provided with different thickness or formed of different materials.

Figure 8:
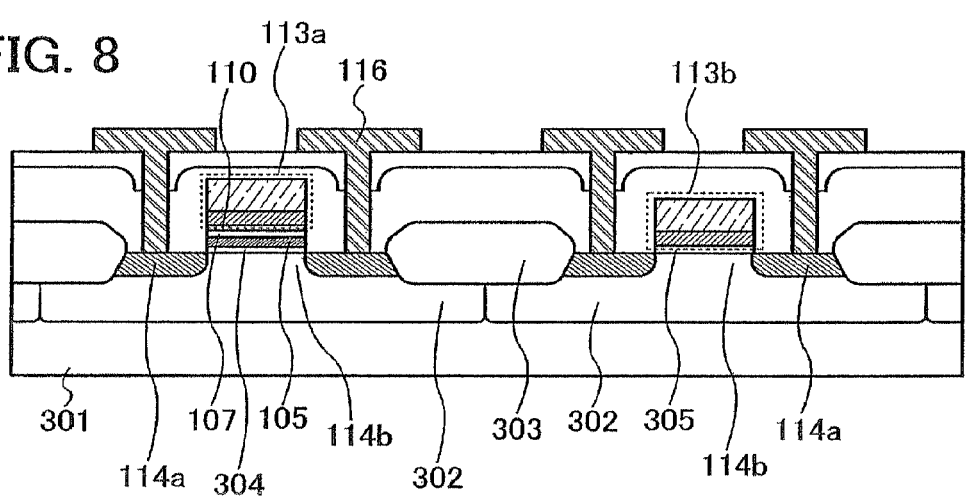
FIG. 8 shows an example of a nonvolatile semiconductor storage device of the present invention.

Although this embodiment mode shows an example of forming a thin film transistor (TFT) by using the semiconductor film formed over the substrate, the nonvolatile semiconductor storage device of the present invention is not limited to this. For example, as shown in FIG. 8, a field effect transistor (PET) of which channel formation region is formed directly in a semiconductor substrate made of Si or the like may be used.

A field effect transistor is formed on a single-crystal semiconductor substrate 301. In the single-crystal semiconductor substrate 301, n wells or p wells 302 which are separated by a field oxide film 303 are formed. When an n-type single-crystal semiconductor substrate is used, only p wells are preferably provided. Meanwhile, when a p-type single-crystal semiconductor substrate is used, only n wells are preferably provided. Gate insulating films 304 and 305 are thin films formed by high-density plasma treatment or a thermal oxidation method. The charge accumulating layer 105, the insulating film 107, the insulating film 110, the conductive films 113a, 113b, and 116, and the like can be formed by the material and the method shown in this embodiment mode.

As thus described, in the case of forming the charge accumulating layer over the semiconductor film with the insulating film functioning as a tunnel oxide film interposed therebetween, the second barrier formed by the insulating film against a charge of the charge accumulating layer is higher in energy than the first barrier formed by the insulating film against a charge of the semiconductor film. Thus, the charges can be easily injected from the semiconductor film to the charge accumulating layer and charge disappearance from the charge accumulating layer can be prevented. Moreover, in the case of forming the charge accumulating layer over the semiconductor film with the insulating film functioning as a tunnel oxide film interposed therebetween, the provision of the charge accumulating layer by using a material with a smaller energy gap (band gap) than the material used for the semiconductor film can make it easier to inject the charges from the semiconductor film to the charge accumulating layer and can prevent charge disappearance from the charge accumulating layer. Accordingly, it becomes possible to manufacture a nonvolatile semiconductor storage device which enables highly-efficient writing at low voltage and which superior to charge holding characteristic.

(Embodiment Mode 2)

Figure 15A:
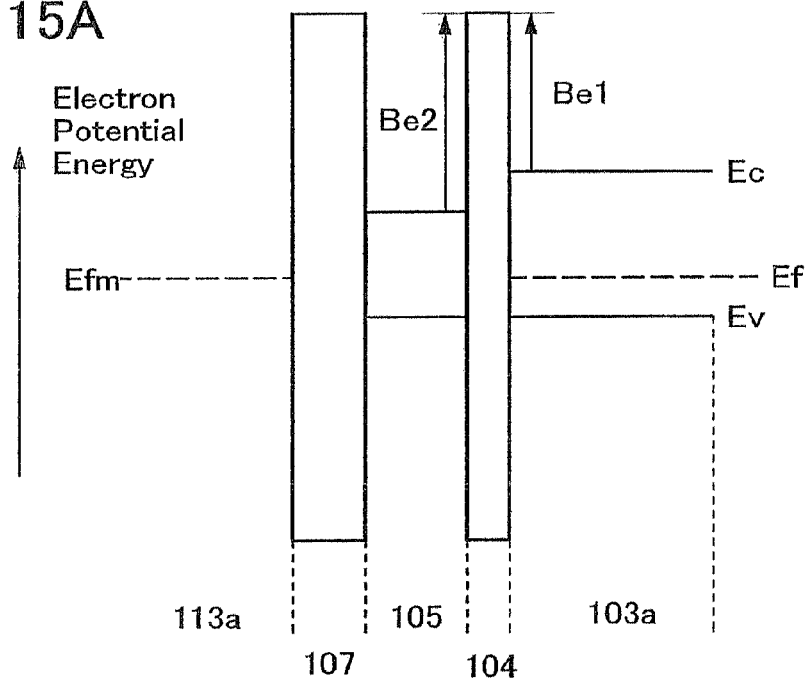
FIGS. 15A and 15B explain movement of charges in a nonvolatile semiconductor storage device of the present invention.
Figure 15B:
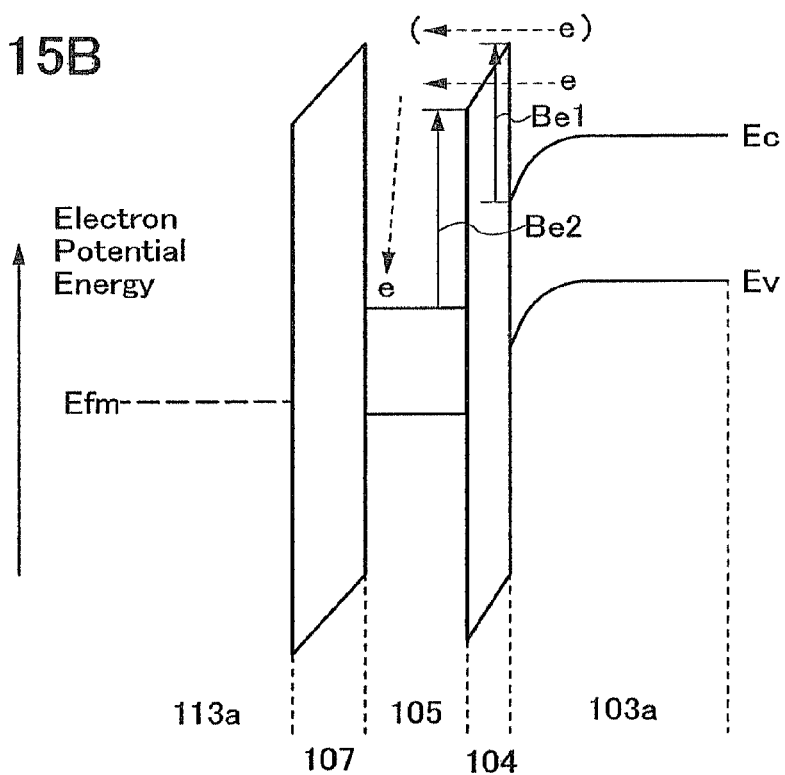
Figure 16:
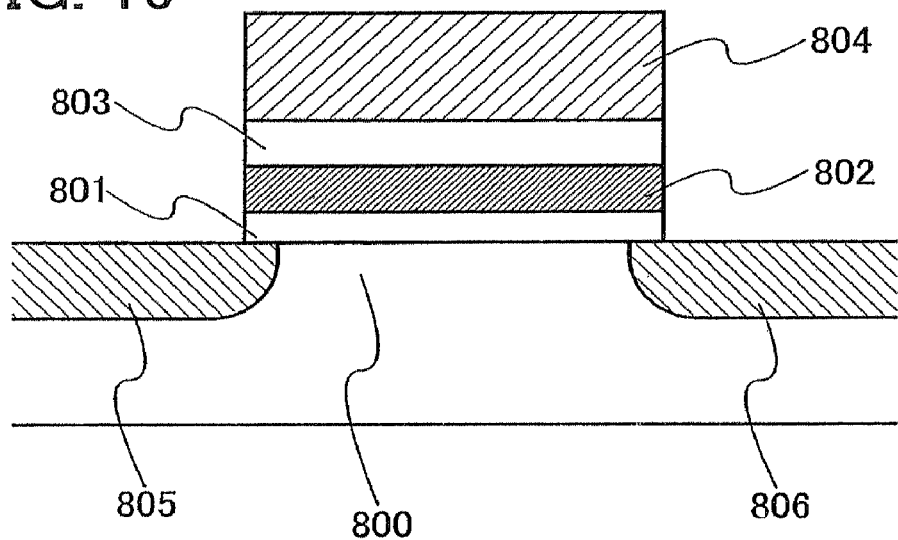
FIG. 16 shows an example of a conventional nonvolatile semiconductor storage device.

Embodiment Mode 2 will explain charge injection and holding in the charge accumulating layer in the memory portion of the nonvolatile semiconductor storage device shown in the above embodiment mode, with reference to FIGS. 15A and 15B.

FIGS. 15A and 15B are band diagrams of the storage element of Embodiment Mode 1, showing a state in which the semiconductor film 103a, the first insulating film 104, the charge accumulating layer 105, the second insulating film 107 (or a stacked film of the second insulating film 107 and the insulating film 110), and the conductive film 113a functioning as a gate electrode are stacked. FIGS. 15A and 15B show a case of using a p-type semiconductor film as the semiconductor film 103a.

FIG. 15A shows a case in which voltage is not applied to the conductive film 113a and in which the Fermi level Ef of the semiconductor film 103a is equal to the Fermi level Elm of the conductive film 113a. FIG. 15B shows a case in which electrons are held in the charge accumulating layer 105 by applying voltage to the conductive film 113a.

The semiconductor film 103a and the charge accumulating layer 105 are formed of different materials with the first insulating film 104 interposed therebetween. In this case, the semiconductor film 103a and the charge accumulating layer 105 have different band gaps (the band gap is an energy difference between the lower end Ec of a conduction band and the upper end Ev of a valence band), and the charge accumulating layer 105 has a smaller band gap than the semiconductor film 103a. For example, when the semiconductor film 103a is formed of silicon (1.12 eV), the charge accumulating layer 105 can be formed of germanium (0.72 eV) or silicon germanium (0.73 to 1.1 eV). In this case, the energy barrier against an electron, i.e., a first barrier Be1 and a second barrier Be2 have different values, satisfying Be2>Be1.

Electrons are injected in the charge accumulating layer 105 by a method using hot electrons or a method using F-N type tunnel current. In a case of using hot electrons, positive voltage is applied to the conductive film 113a functioning as a gate electrode. When high voltage is applied to a drain in this state to generate hot electrons, hot electrons that can overcome the first barrier can be injected in the charge accumulating layer 105. In a case of using F-N type tunnel current, it is not necessary to give electrons the energy to overcome the first barrier and electrons are injected in the charge accumulating layer 105 by the quantum tunnel phenomenon.

While electrons are held in the charge accumulating layer 105, threshold voltage of a transistor shifts to the positive side. This state can be regarded as a state in which information "0" has been written. The information "0" can be detected by a sensing circuit which detects that the transistor is not turned on when gate voltage to turn on the transistor is applied in a state that charges are not held in the charge accumulating layer 105.

The characteristic of holding electrons accumulated in the charge accumulating layer 105 is important. By increasing the second barrier Be2, electrons flowing to the semiconductor film 103a by the quantum tunnel current can be decreased stochastically and moreover, electrons flowing to the conductive film 113a through the second insulating film 104 can also be decreased. That is to say, as a method for holding electrons accumulated in the charge accumulating layer 105 for a long period of time, by increasing the second barrier Be2 to exceed the first barrier Be1, it is possible to prevent the charges from flowing to the semiconductor film 103a to disappear in a state of storage holding at which voltage is not applied to the conductive film 113a.

By providing the storage element with the aforementioned structure, charges can be easily injected from the semiconductor film to the charge accumulating layer, and moreover, charge disappearance from the charge accumulating layer can be prevented. That is to say, in a case of operating as a memory, highly-efficient writing is possible at low voltage, and the charge holding characteristic can be improved.

(Embodiment Mode 3)

Embodiment Mode 3 will explain a manufacturing method of a nonvolatile semiconductor storage device which is different from that in the above embodiment mode, with reference to drawings. Specifically, a case of using an insulating film including dispersed particles as a charge accumulating layer will be explained.

Figure 3A:
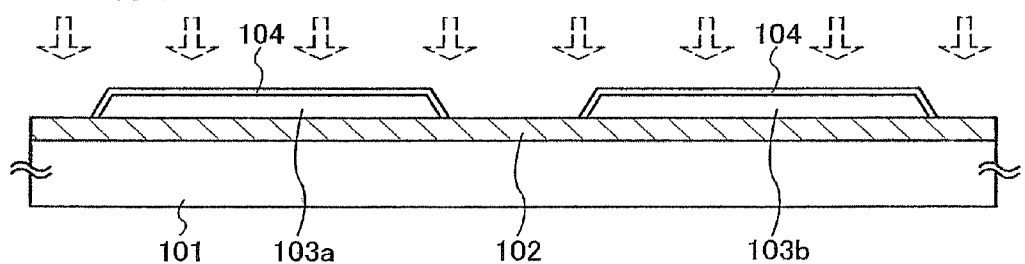
FIGS. 3A to 3C show an example of a manufacturing method of a nonvolatile semiconductor storage device of the present invention.

First, the island-shaped semiconductor films 103a and 103b are formed over the substrate 101 with the insulating film 102 interposed therebetween, and the first insulating film 104 is formed on the surfaces of the semiconductor films 103a and 103b by high-density plasma treatment (FIG. 3A). A specific formation method may be similar to the steps shown in FIGS. 1A and 1B.

Figure 3B:
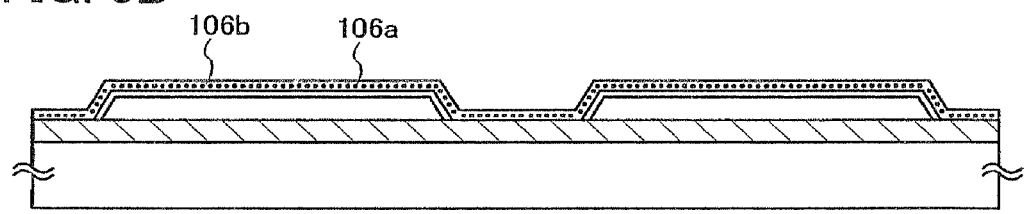

Subsequently, an insulating film 106b (charge accumulating layer 106b) having such a property as to trap charges is formed so as to cover the insulating film 104. The insulating film 106b is preferably formed by using an insulating film having defects for trapping charges in the film, or an insulating film including conductive particles or semiconductor particles 106a (hereinafter also referred to as dispersed particles 106a). For example, a germanium oxide ($GeO_x$) film, a germanium nitride ($GeN_x$) film, or the like can be used (FIG. 3B). As the charge accumulating layer 106b including the dispersed particles 106a, for example, an insulating film including a metal element can be used; specifically, a metal oxide film, a metal nitride film, a metal film including oxygen and nitrogen, or the like can be used. As the dispersed particles 106a, particles of germanium (Ge), a silicon-germanium alloy, or the like can be included.

For example, as the charge accumulating layer 106b, an insulating film including germanium can be formed with a thickness of 1 to 20 nm, preferably 5 to 10 nm, in an atmosphere including a germanium element (for example, $GeH_4$) by a plasma CVD method. As the insulating film including germanium, a germanium oxide ($GeO_x$) film, a germanium nitride ($GeN_x$) film, or the like can be formed in an atmosphere including $GeH_4$ and oxygen and/or nitrogen by a plasma CVD method.

When the semiconductor film is formed of a material containing Si as its main component and the charge accumulating layer is formed by an insulating film which includes germanium (for example, $GeN_x$) and which has defects for trapping charges in the film, or an insulating film including germanium particles, over the semiconductor film with the insulating film functioning as a tunnel oxide film interposed therebetween, carriers injected from the semiconductor film through the insulating film are held by being trapped in the defects or the germanium particles in the charge accumulating layer.

Figure 3C:
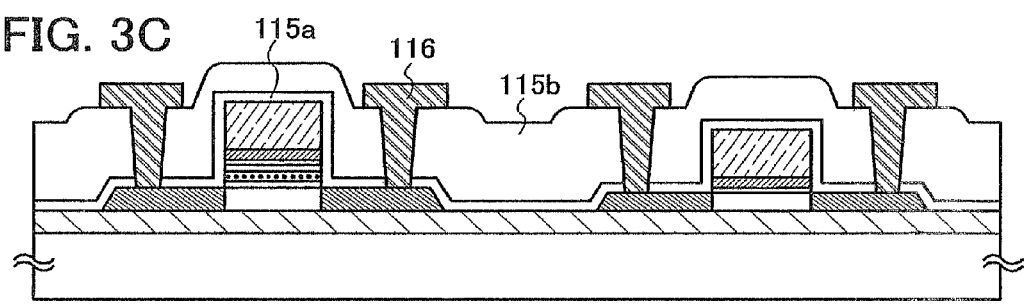

After that, by the steps shown in FIGS. 1D to 2E as aforementioned, a nonvolatile semiconductor storage device having a storage element can be manufactured (FIG. 3C).

As shown in this embodiment mode, when the charge accumulating layer is formed by using the insulating film having defects for trapping charges in the film or the insulating film including dispersed particles, even in a case where the insulating film functioning as a tunnel oxide film has a defect, it is possible to prevent all the charges accumulated in the charge accumulating layer from flowing out from the defect of the insulating film to the semiconductor film. The charge accumulating layer formed by a germanium oxide film or a germanium nitride film including dispersed particles has its energy band formed by the dispersed particles as shown in FIGS. 15A and 15B, thereby obtaining a similar operation effect. Thus, by using the structure shown in this embodiment mode, a storage element with high reliability in which data can be easily written and accumulated charges do not easily disappear can be obtained.

(Embodiment Mode 4)

Embodiment Mode 4 will explain a manufacturing method of a nonvolatile semiconductor storage device, which is different from that in the above embodiment mode, with reference to drawings.

Figure 4A:
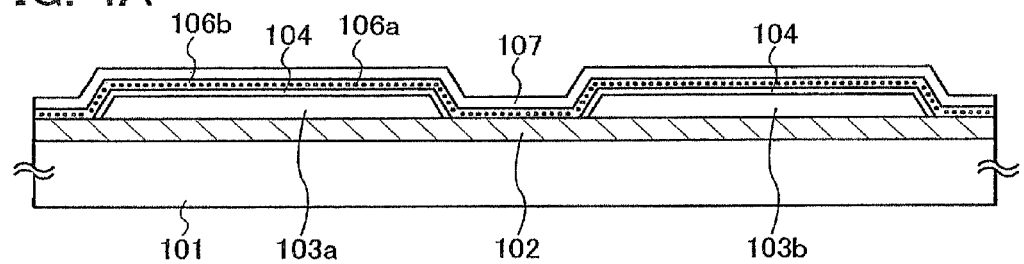
FIGS. 4A to 4D show an example of a manufacturing method of a nonvolatile semiconductor storage device of the present invention.

First, the island-shaped semiconductor films 103a and 103b are formed over the substrate 101 with the insulating film 102 interposed therebetween. Then, the insulating film 104, the charge accumulating layer 106b, and the insulating film 107 are formed so as to cover the island-shaped semiconductor films 103a and 103b (FIG. 4A). The manufacturing method can be similar to that shown in FIGS. 1A to 1D. Although the charge accumulating layer shown in Embodiment Mode 2 is used as the charge accumulating layer in this embodiment mode, the charge accumulating layer 105 shown in Embodiment Mode 1 may be used.

Figure 4B:
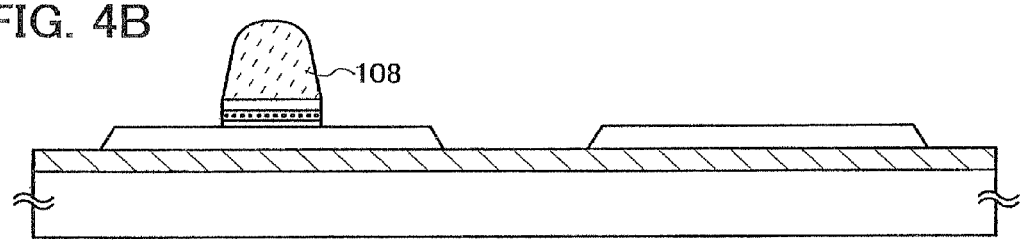

Next, the resist 108 is selectively formed so as to cover at least a part of an element included in a memory portion. Then, the insulating film 104, the charge accumulating layer 105, and the insulating film 107 which are formed over the element included in the memory portion and which are not covered with the resist 108, and those formed over an element included in a logic portion are selectively removed (FIG. 4B). Here, after selectively forming the resist 108 so as to cover at least a part of the insulating film 107 formed over the semiconductor film 103a, the insulating film 104, the charge accumulating layer 105, and the insulating film 107 which are formed over the semiconductor film 103a and which are not covered with the resist 108, and those formed over the semiconductor film 103b are selectively removed, thereby partially exposing a surface of a part of the semiconductor film 103a and a surface of the semiconductor film 103b.

Figure 4C:
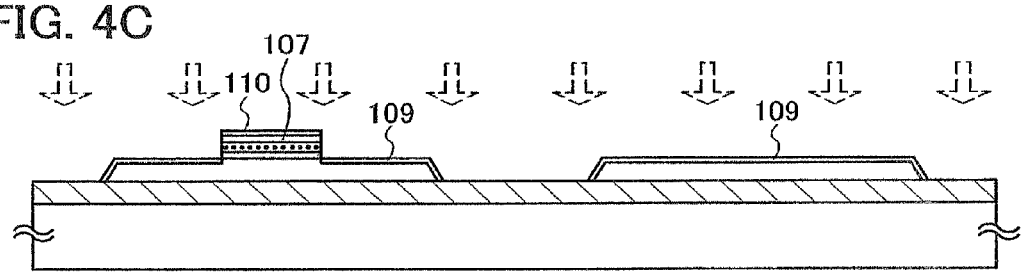

Subsequently, oxidation treatment, nitridation treatment, or oxynitridation treatment is performed by high-density plasma treatment (FIG. 4C). As a result, the insulating film 110 is formed on the surface of the insulating film 107 and the insulating film 109 is formed on the exposed surfaces of the semiconductor films 103a and 103b. Here, the insulating film 110 having a film including oxygen and nitrogen (here, a silicon nitride oxide film or a silicon oxynitride film) is formed on the surface of the insulating film 107 by performing high-density plasma treatment under an oxygen atmosphere on the insulating film 107 formed by a silicon nitride film or a silicon nitride oxide film. At the same time, the insulating film 109 having a silicon oxide film is formed on the surface of the semiconductor film 103b. It is to be noted that the high-density plasma treatment can be performed by the condition and the method shown in FIG. 1B.

Figure 4D:
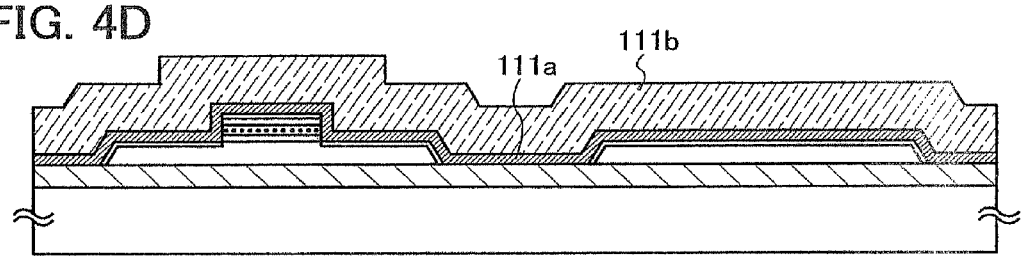

Subsequently, a conductive film is formed over the semiconductor films 103a and 103b (FIG. 4D). Here, an example is shown in which a stack of the conductive film 111a and the conductive film 111b is formed as the conductive film. The conductive film may have a single-layer structure or a stacked-layer structure including three or more layers.

Each of the conductive films 111a and 111b can be formed of an element selected from tantalum (Ta), tungsten (W), titanium (Ti), molybdenum (Mo), aluminum (Al), copper (Cu), chromium (Cr), niobium (Nb), and the like or an alloy or compound material including any of these elements as its main component. Moreover, a semiconductor material typified by polycrystalline silicon doped with an impurity element such as phosphorus can be used. Here, the conductive film 111a is formed of tantalum nitride and the conductive film 111b is formed of tungsten over the conductive film 111a. In addition, the conductive film 111a can be formed of tungsten nitride, molybdenum nitride, or titanium nitride, and the conductive film 111b can be formed of tantalum, molybdenum, titanium, or the like. The conductive films 111a and 111b can be formed by combining these materials freely.

Figure 5A:
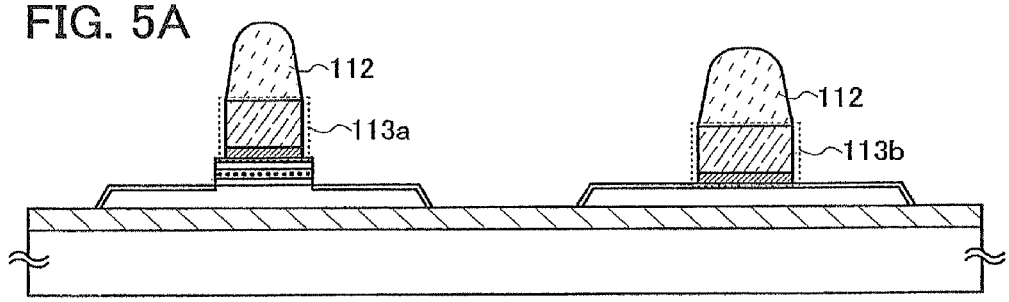
FIGS. 5A to 5C show an example of a manufacturing method of a nonvolatile semiconductor storage device of the present invention.

Next, the resist 112 is selectively formed over the conductive film 111b formed over the semiconductor films 103a and 103b. Then, the insulating film 104, the charge accumulating layer 105, the insulating film 107, the insulating film 110, and the conductive films 111a and 111b which are provided over the semiconductor film 103a, and the insulating film 109 and the conductive films 111a and 111b which are provided over the semiconductor film 103b are selectively removed by using the resist 112 as a mask (FIG. 5A).

In this embodiment mode, the resist 112 provided over the semiconductor film 103a is formed so that the width of the resist 112 is approximately equal to or smaller than the width of the stacked-layer structure of the insulating film 104, the charge accumulating layer 105, the insulating film 107, and the insulating film 110 which are formed under the conductive films 111a and 111b. As a result, the width of the obtained conductive film 113a is approximately equal to or smaller than the width of the stacked-layer structure of the insulating film 104, the charge accumulating layer 105, the insulating film 107, and the insulating film 110 which are formed under the conductive films 111a and 111b.

Figure 5B:
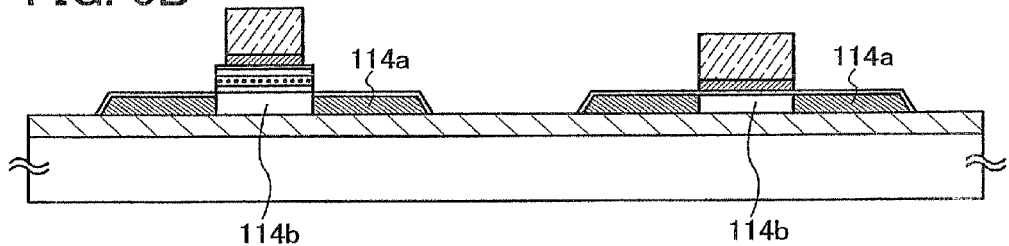

Next, an impurity element is introduced in the semiconductor film 103a and the semiconductor film 103b; thus, the impurity regions 114a which can function as source or drain regions are formed in the semiconductor film 103a and the semiconductor film 103b and the channel formation regions 114b are each formed between the impurity regions 114a that are provided apart from each other (FIG. 5B). The impurity regions 114a and the channel formation regions 114b can be formed in the semiconductor film 103b in a self-aligning manner by using the conductive film 113b functioning as a gate electrode as a mask when the impurity element is introduced in the semiconductor film 103b.

Figure 5C:
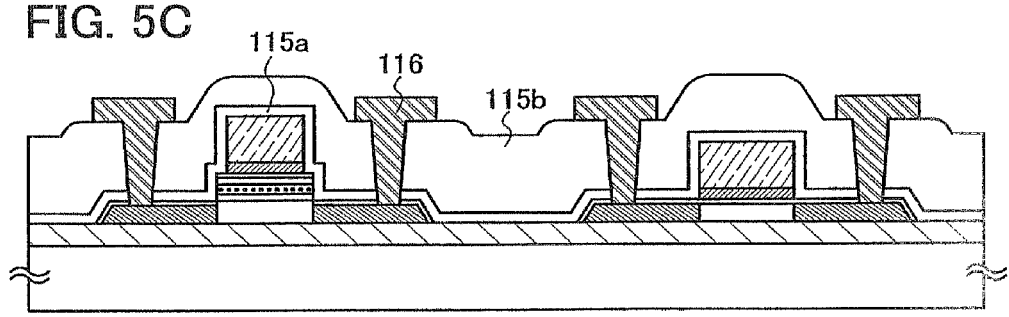

Next, an insulating film is formed over the semiconductor films 103a and 103b and the conductive films 113a and 113b (FIG. 5C). Here, an example is shown in which the insulating film is formed by stacking the insulating film 115a and the insulating film 115b. Alternatively, the insulating film may have a single-layer structure or a stacked-layer structure including three or more layers. After that, contact holes are selectively formed in the insulating films 115a and 115b to expose the semiconductor films 103a and 103b, and then the conductive film 116 is selectively formed so as to fill the contact holes. The conductive film 116 is electrically connected to the impurity regions 114a of the semiconductor films 103a and 103b.

Figure 6A:
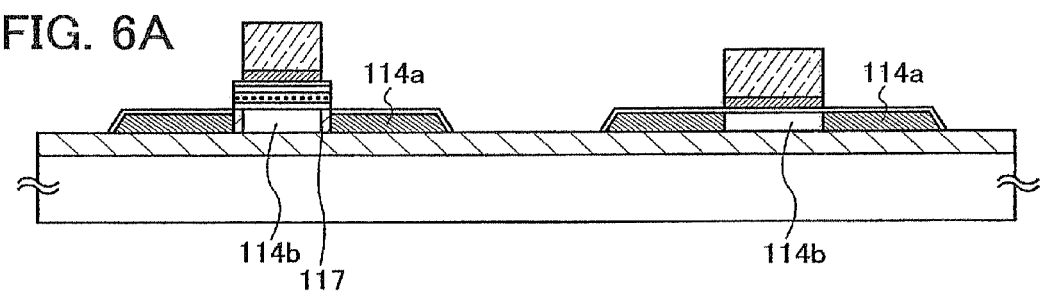
FIGS. 6A and 6B show an example of a manufacturing method of a nonvolatile semiconductor storage device of the present invention.

When the width of the conductive film 113a formed over the semiconductor film 103a is smaller than the width of the stacked-layer structure of the insulating film 104, the charge accumulating layer 105, the insulating film 107, and the insulating film 110, low-concentration impurity regions 117 in each of which an impurity element is introduced at lower concentration than in the impurity regions 114a can be formed in the semiconductor film 103a by controlling the condition for introducing the impurity element in the semiconductor films 103a and 103b in FIG. 5B (FIG. 6A). The low-concentration impurity region is formed in a part of the semiconductor film 103a that is under the insulating film 104 and is also under a region where the conductive film 113a does not overlap with the insulating film 104, the charge accumulating layer 105, the insulating film 107, and the insulating film 110 (a region where the channel formation region 114b does not overlap with the conductive film 113a).

Figure 6B:
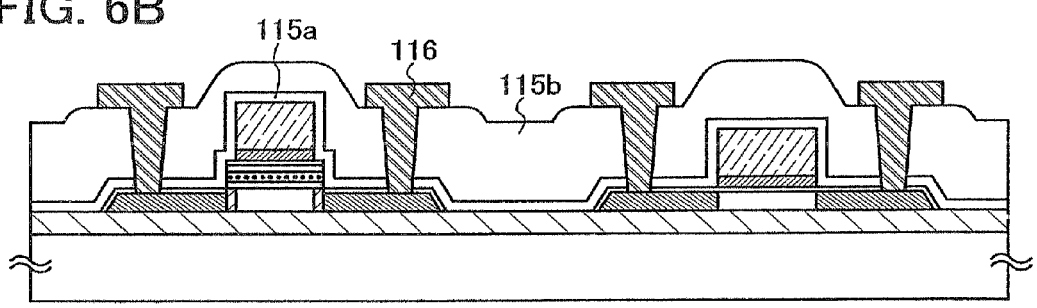

After that, the insulating films 115a and 115b and the conductive film 116 are formed similarly to FIG. 5C, thereby obtaining a nonvolatile semiconductor storage device having a storage element (FIG. 6B).

This embodiment mode can be freely combined with any of the above embodiment modes.

(Embodiment Mode 5)

With reference to drawings, Embodiment Mode 5 will explain a manufacturing method of a semiconductor device, in which formation of an insulating film, a conductive film, or a semiconductor film and plasma treatment are performed continuously in a manufacturing process of a nonvolatile semiconductor storage device.

Figure 7A:
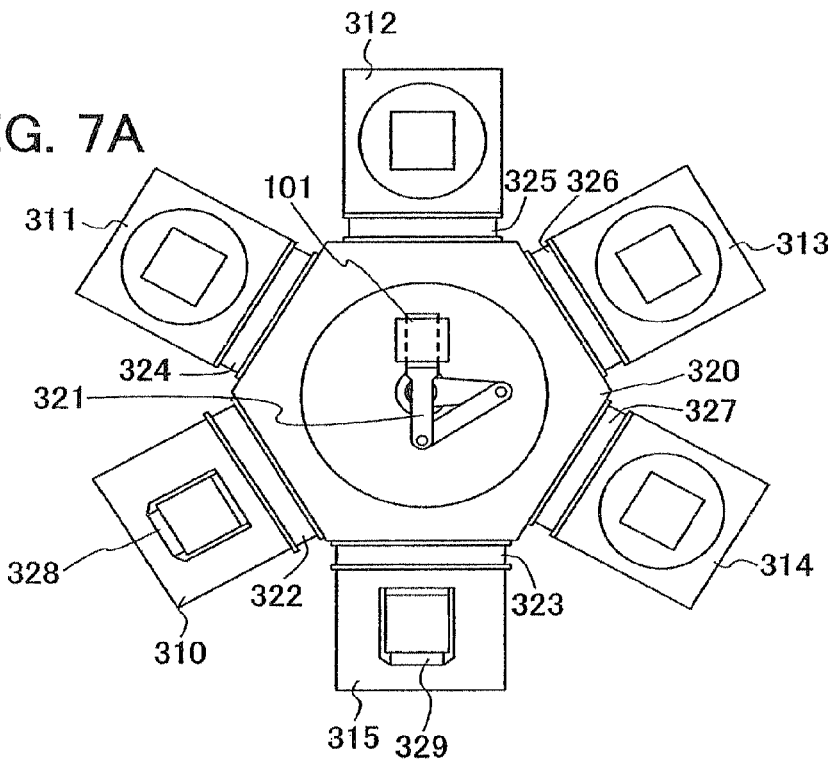
FIGS. 7A and 7B show examples of an apparatus for manufacturing a nonvolatile semiconductor storage device of the present invention.

When formation of an insulating film, a conductive film, or a semiconductor film and plasma treatment are performed continuously, an apparatus equipped with a plurality of chambers can be used. An example of the apparatus equipped with a plurality of chambers is shown in FIG. 7A. It is to be noted that FIG. 7A is a top view of a structure example of the apparatus shown in this embodiment mode (continuous film-formation system).

The apparatus shown in FIG. 7A includes a first chamber 311, a second chamber 312, a third chamber 313, a fourth chamber 314, load lock chambers 310 and 315, and a common chamber 320. Each of these chambers has airtightness and is provided with a vacuum evacuation pump and an inert gas introduction system.

The load lock chambers 310 and 315 are chambers for carrying a sample (substrate to be processed) in the system. The first to fourth chambers are chambers in which formation of a conductive film, an insulating film, or a semiconductor film over the substrate 101, etching, plasma treatment, and the like are performed. The common chamber 320 is provided in common with the load lock chambers 310 and 315 and the first to fourth chambers. Gate valves 322 to 327 are provided between the common chamber 320 and the load lock chambers 310 and 315 and between the common chamber 320 and the first to fourth chambers 311 to 314. The common chamber 320 is provided with a robot arm 321 by which the substrate 101 is delivered to each chamber.

As a specific example, described below is a case where a semiconductor film formed over the substrate 101 is oxidized by plasma treatment in the first chamber 311 and nitrided by plasma treatment in the second chamber 312, a charge accumulating layer is formed in the third chamber 313, and an insulating film is formed in the fourth chamber 314.

First, a cassette 328 housing a plurality of substrates 101 is carried in the load lock chamber 310. After the cassette 328 is carried therein, a door of the load lock chamber 310 is closed. In this state, the gate valve 322 is opened to take out one substrate to be processed from the cassette 328, and then the substrate is disposed in the common chamber 320 by the robot arm 321. Alignment of the substrate 101 is performed in the common chamber 320 at this time.

Next, the gate valve 322 is closed and the gate valve 324 is then opened to transfer to the first chamber 311, the substrate 101 where the island-shaped semiconductor film is formed. In the first chamber 311, first high-density plasma treatment is performed. Here, the first high-density plasma treatment is performed under an oxygen atmosphere in the first chamber 311 to form an oxide film on a surface of the semiconductor film. The first high-density plasma treatment may be performed under the condition shown in Embodiment Mode 1.

Next, the substrate 101 is taken out to the common chamber 320 by the robot arm 321, and transferred to the second chamber 312. In the second chamber 312, second high-density plasma treatment is performed. Here, the second high-density plasma treatment is performed under a nitrogen atmosphere to nitride the oxide film formed on the surface of the semiconductor film.

Subsequently, the substrate 101 is taken out to the common chamber 320 by the robot arm 321 and transferred to the third chamber 313. In the third chamber 313, the charge accumulating layer is formed by a plasma CVD method. The charge accumulating layer may be formed of the material shown in Embodiment Mode 1 or 2. Here, a film including germanium is formed by a plasma CVD method. Although the example of using a plasma CVD method is shown here, a sputtering method using a target may also be employed.

Next, the substrate 101 is taken out to the common chamber 320 by the robot arm 321 and transferred to the fourth chamber 314. In the fourth chamber 314, an insulating film is formed by a plasma CVD method. For example, an insulating film including nitrogen is formed by a plasma CVD method.

Then, the substrate 101 is transferred to the load lock chamber 315 by the robot arm 321 and housed in a cassette 329.

It is to be noted that FIG. 7A shows just one example, and the number of chambers can be increased further. Although FIG. 7A shows the example of using single-type chambers as the first to fourth chambers 311 to 314, batch-type chambers may be used to process plural substrates at one time.

By using the apparatus shown in this embodiment mode in this manner, the formation of a conductive film, an insulating film, or a semiconductor film and the high-density plasma treatment can be performed continuously without exposure to the air. This can achieve prevention of impurity mixture and improvement of production efficiency.

Next, in the present invention, an example of an apparatus in the case of performing high-density plasma treatment is explained with reference to FIG. 7B.

Figure 7B:
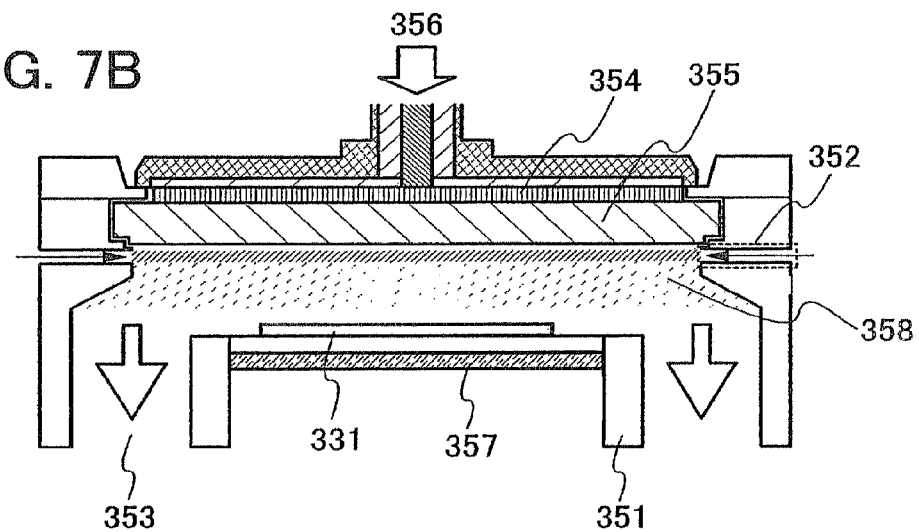

The apparatus shown in FIG. 7B includes a support 351 for having an object 331 to be processed disposed thereon, on which high-density plasma treatment is to be performed; a gas supplying portion 352 for introducing gas; an evacuation port 353; an antenna 354; a dielectric plate 355; and a high-frequency supplying portion 356 which supplies high frequency for high-density plasma generation. Moreover, the temperature of the object 331 to be processed can be controlled when the support 351 is provided with a temperature controlling portion 357. An example of the high-density plasma treatment is hereinafter explained. Any object on which plasma treatment is performed in the above embodiment mode can be used as the object to be processed.

First, the processing chamber is made vacuum and a gas including oxygen or nitrogen is introduced from the gas supplying portion 352. For example, as the gas including oxygen, a mixed gas of oxygen ($O_2$) and a noble gas or a mixed gas of oxygen, hydrogen, and a noble gas can be introduced. As the gas including nitrogen, a mixed gas of nitrogen and a noble gas or a mixed gas of $NH_3$ and a noble gas can be introduced. Next, the object 331 to be processed is disposed on the support 351 having the temperature controlling portion 357 and the object 331 to be processed is heated at temperatures ranging from 100° C. to 550° C. It is to be noted that the distance between the object 331 to be processed and the dielectric plate 355 ranges from 20 to 80 mm (preferably 20 to 60 mm).

Next, a microwave is supplied from the high-frequency supplying portion 356 to the antenna 354. Here, a microwave with a frequency of 2.45 GHz is supplied. Then, the microwave is introduced in the processing chamber from the antenna 354 through the dielectric plate 355; thus, high-density plasma 358 activated by plasma excitation is generated. For example, when plasma treatment is performed in an atmosphere including an $NH_3$ gas and an Ar gas, high-density excited plasma in which the $NH_3$ gas and the Ar gas are mixed is generated by the microwave. In the high-density excited plasma in which the $NH_3$ gas and the Ar gas are mixed, the introduced microwave makes the Ar gas excited to generate radicals (Ar.), and when the Ar radicals and $NH_3$ molecules collide with each other, radicals (NH.) are generated. This NH. and the object 331 to be processed react with each other, thereby nitriding the object 331 to be processed. After that, the $NH_3$ gas and the Ar gas are exhausted to the outside of the processing chamber from the evacuation port 353.

By performing the plasma treatment using the apparatus shown in FIG. 7B in this manner, the object to be processed with little plasma damage can be formed because the electron temperature is low (1.5 eV or less) and the electron density is high ($1 \times 10^{11}$ cm$^{-3}$ or more).

It is to be noted that this embodiment mode can be freely combined with any of the above embodiment modes.

(Embodiment Mode 6)

Embodiment Mode 6 will explain a manufacturing method of a nonvolatile semiconductor storage device, which is different from that in the above embodiment mode, with reference to drawings. Specifically, description is made of a case in which gate insulating films of plural transistors provided in a logic portion have different thickness in a semiconductor device having a memory portion and the logic portion.

When plural functional circuits are provided by using plural thin film transistors in the logic portion, it may be preferable to form gate insulating films of the thin film transistors provided in the respective functional circuits with different thickness because each circuit demands a different characteristic. For example, in order to reduce drive voltage and variation in threshold voltage, the thin film transistor preferably has a thin gate insulating film. Meanwhile, in order to increase the drive voltage and voltage withstanding property of the gate insulating film, the thin film transistor preferably has a thick gate insulating film. For example, a thin insulating film formed by the high-density plasma treatment shown in the above embodiment mode is applied to a circuit of which drive voltage and variation in threshold voltage are demanded to be low. On the contrary, a thick insulating film is applied to a circuit of which drive voltage and voltage withstanding property of the gate insulating film are demanded to be high. Description is hereinafter made with reference to drawings.

First, the island-shaped semiconductor film 103a, the island-shaped semiconductor film 103b, and an island-shaped semiconductor film 103c are formed over the substrate 101 with the insulating film 102 interposed therebetween (FIG. 9A). Here, the semiconductor film 103a is included in an element of the memory portion while the semiconductor film 103b and the semiconductor film 103c are included in elements of the logic portion.

Each of the semiconductor films 103a and 103b is preferably formed by using a crystalline semiconductor film. The crystalline semiconductor film includes one obtained by crystallizing an amorphous semiconductor film formed over the insulating film 102 through thermal treatment or laser irradiation, one obtained by making a crystalline semiconductor film formed over the insulating film 102 into amorphous and recrystallizing it, and so on.

When the crystallization or the recrystallization is conducted by laser irradiation, an LD-pumped continuous wave (CW) laser ($YVO_4$, second harmonic (wavelength: 532 nm)) can be used as a laser light source. The wavelength is not necessarily limited to the second harmonic; however, the second harmonic is superior to other higher harmonics in point of energy efficiency. When a semiconductor film is irradiated with CW laser light, the semiconductor film continuously receives energy; therefore, once the semiconductor film is melted, the melted state can continue. Moreover, it is possible to move a solid-liquid interface of the semiconductor film by scanning CW laser light and to form a crystal grain which is long in one direction along this moving direction. A solid-state laser is used because its output is so stable that a stable process can be expected as compared with a gas laser or the like. Not only a CW laser but also a pulsed laser with a repetition rate of 10 MHz or more can be used. In a case of using a pulsed laser with high repetition rate, when the pulse interval is shorter than the period after the semiconductor film is melted and before the melted semiconductor film is solidified, the semiconductor film can normally maintain a melting state. Then, by moving the solid-liquid interface, the semiconductor film including a crystal grain which is long in one direction can be formed. Another CW laser or pulsed laser with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. Moreover, a ceramic laser such as a YAG laser, a $Y_2O_3$ laser, a $GdVO_4$ laser, or a $YVO_4$ laser is given. As a metal vapor laser, a helium-cadmium laser or the like is given. Moreover, oscillation of laser light with TEM$_{00}$ (single transverse mode) in a laser oscillator is preferable because the energy homogeneity of a linear beam spot on an irradiation surface can be raised. In addition, a pulsed excimer laser may be used.

Subsequently, the insulating film 104, the charge accumulating layer 105, and the insulating film 107 are formed over the semiconductor films 103a to 103c (FIG. 9B).

The insulating film 104 is formed with a thickness of 1 to 10 nm, preferably 5 to 10 nm, by performing oxidation treatment or nitridation treatment on the semiconductor films 103a to 103c by high-density plasma treatment. Here, a silicon oxide film is formed on surfaces of the semiconductor films 103a to 103c by performing oxidation treatment by high-density plasma treatment using a material containing Si as its main component for the semiconductor films 103a to 103c, and then nitridation treatment is performed by high-density plasma treatment to form a film including oxygen and nitrogen on a surface of the silicon oxide film.

The charge accumulating layer 105 is provided over the insulating film 104. The charge accumulating layer 105 is preferably formed of a material with a smaller energy gap (band gap) than the material used for the semiconductor films 103a and 103b. Here, the charge accumulating layer 105 is formed by a film containing germanium as its main component with a thickness of 1 to 20 nm, preferably 5 to 10 nm, in an atmosphere including GeH$_4$ by a plasma CVD method. The charge accumulating layer shown in Embodiment Mode 3 may be used as the charge accumulating layer 105.

When each of the semiconductor films 103a to 103c is formed of the material containing Si as its main component and the film including germanium with a smaller energy gap than Si is provided as the charge accumulating layer 105 over the semiconductor films 103a to 103c with the insulating film 104 functioning as a tunnel oxide film interposed therebetween, a second barrier formed by the insulating film 104 against a charge of the charge accumulating layer 105 gets higher in energy than a first barrier formed by the insulating film 104 against a charge of the semiconductor film 103a. As a result, charges can be easily injected from the semiconductor film 103a to the charge accumulating layer 105 and charge disappearance from the charge accumulating layer 105 can be prevented. That is to say, in a case of operating as a memory, highly-efficient writing is possible at low voltage and moreover, the charge holding characteristic can be improved.

The insulating film 107 is formed over the charge accumulating layer 105 by using a silicon oxynitride film, a silicon nitride film, a silicon nitride oxide film, or the like. Here, the insulating film 107 is formed by using a silicon nitride film or a silicon nitride oxide film with a thickness of 1 to 20 nm, preferably 5 to 10 nm, by a plasma CVD method. Alternatively, the charge accumulating layer 105 may be subjected to high-density plasma treatment under a nitrogen atmosphere to perform nitridation treatment so that a nitride film (for example, GeN$_x$ in a case of using a film containing germanium as its main component as the charge accumulating layer 105) is formed on a surface of the charge accumulating layer 105. In the latter case, the nitride film obtained by the nitridation treatment may be used as the insulating film 107 or the aforementioned insulating film may be separately formed as the insulating film 107 over the nitride film obtained by the nitridation treatment. In addition, the insulating film 107 may be formed of aluminum oxide (AlO$_x$), hafnium oxide (HfO$_x$), or tantalum oxide (TaO$_x$).

Next, after selectively forming the resist 108 so as to cover the element included in the memory portion, the insulating film 104, the charge accumulating layer 105, and the insulating film 107, which are formed over the element included in the logic portion, are selectively removed (FIG. 9C). Here, after selectively forming the resist 108 so as to cover the insulating film 107 formed over the semiconductor film 103a, the insulating film 104, the charge accumulating layer 105, and the insulating film 107, which are formed over the semiconductor films 103b and 103c, are selectively removed, thereby exposing the semiconductor films 103b and 103c.

Figure 10A:
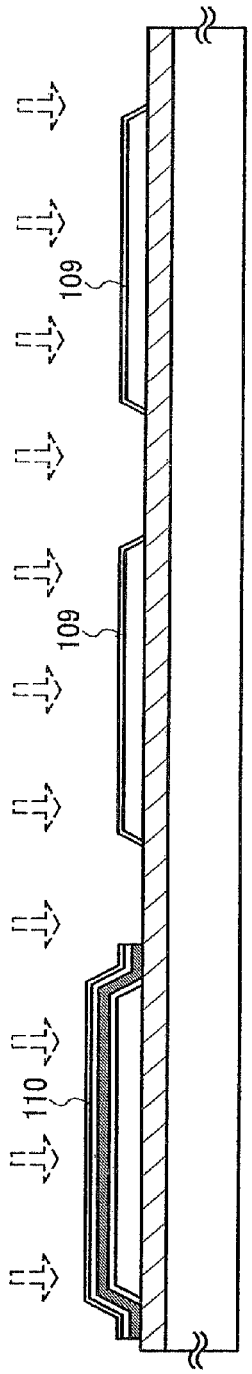
FIGS. 10A to 10C show an example of a manufacturing method of a nonvolatile semiconductor storage device of the present invention.

Next, oxidation treatment, nitridation treatment, or oxynitridation treatment is performed by high-density plasma treatment (FIG. 10A). As a result, the insulating film 110 is formed on a surface of the insulating film 107 formed over the semiconductor film 103a, and the insulating film 109 is formed on surfaces of the semiconductor films 103b and 103c. Here, the insulating film 110 having a film including oxygen and nitrogen (here, a silicon nitride oxide film or a silicon oxynitride film) is formed on the surface of the insulating film 107 by performing high-density plasma treatment under an oxygen atmosphere on the insulating film 107 which is formed by a silicon nitride film or a silicon nitride oxide film. At the same time, the insulating film 109 having a silicon oxide film is formed on the surface of the semiconductor film 103b.

Figure 10B:
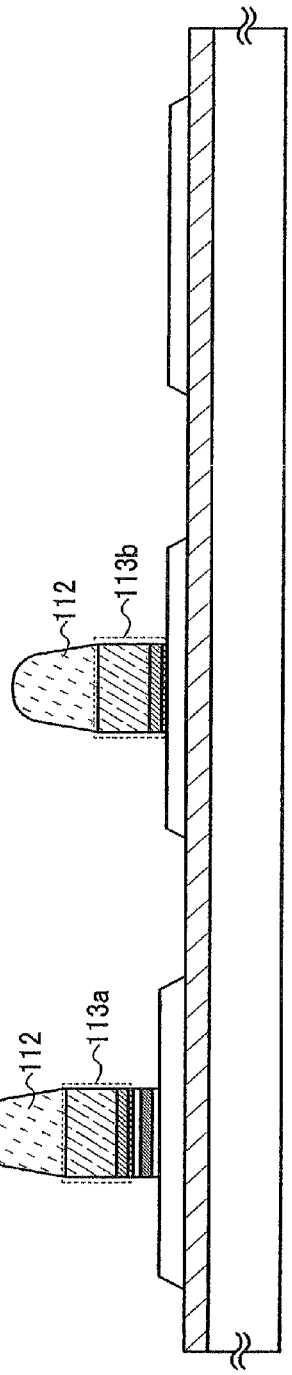

Subsequently, a conductive film is formed over the semiconductor films 103a to 103c. Then, the resist 112 is selectively formed over the conductive film positioned over the semiconductor films 103a and 103b. By selectively etching the conductive film, the conductive films 113a and 113b are formed over the semiconductor films 103a and 103b, and the conductive film formed over the semiconductor film 103c is removed (FIG. 10B). The conductive films 113a and 113b can be formed of the material used for the conductive films 111a and 111b shown in the above embodiment mode.

Figure 10C:
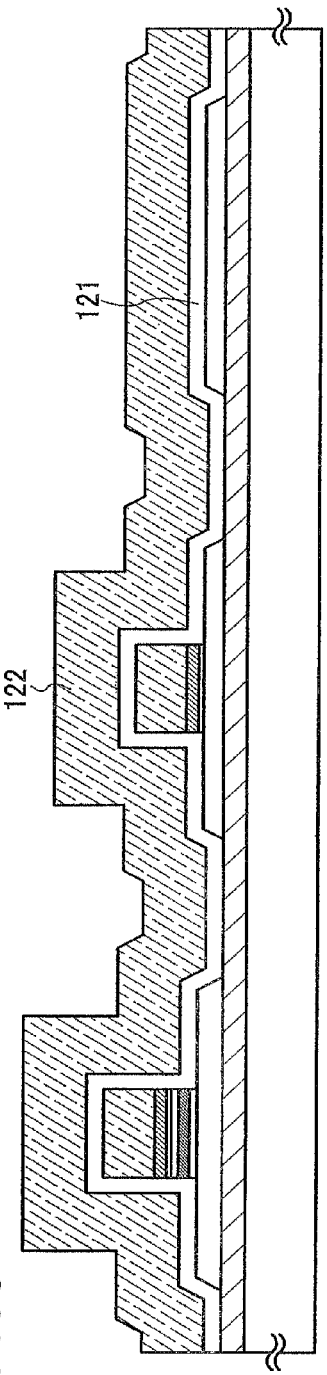

Next, an insulating film 121 is formed so as to cover the exposed surfaces of the semiconductor films 103a to 103c and the conductive films 113a and 113b, and then a conductive film 122 is formed over the insulating film 121 (FIG. 10C). The insulating film 121 functions as a gate insulating film of a thin film transistor including the semiconductor film 103c.

Next, a resist 123 is selectively formed over the conductive film 122 formed over the semiconductor film 103c. Then, the conductive film 122 and the insulating film 121 are selectively removed by using the resist 123 as a mask (FIG. 11A).

Next, an impurity element is introduced in the semiconductor films 103a to 103c; thus, the impurity regions 114a which can function as source or drain regions are formed in the semiconductor films 103a to 103c and the channel formation regions 114b are each formed between the impurity regions 114a that are provided apart from each other (FIG. 11B). The impurity regions 114a and the channel formation regions 114b can be formed in a self-aligning manner by using as a mask the conductive films 113a, 113b, and 124 functioning as gate electrodes when the impurity element is introduced in the semiconductor films 103a to 103c.

Subsequently, an insulating film is formed over the conductive films 113a, 113b, and 124 and the exposed semiconductor films 103a to 103c (FIG. 11C). Here, an example of a stack of the insulating film 115a and the insulating film 115b is shown as the insulating film. The insulating film may have a single-layer structure or a stacked-layer structure including three or more layers. After that, contact holes are selectively formed in the insulating films 115a and 115b to expose the semiconductor films 103a to 103c, and then the conductive film 116 is selectively formed so as to fill the contact holes. The conductive film 116 is electrically connected to the impurity regions 114a of the semiconductor films 103a to 103c.

This embodiment mode can be freely combined with any of the above embodiment modes.

(Embodiment Mode 7)

Embodiment Mode 7 will describe an application example of a semiconductor device which is provided with the nonvolatile semiconductor storage device shown in the above embodiment mode and in which data can be inputted/outputted without contact, with reference to drawings. The semiconductor device in which data can be inputted/outputted without contact is also referred to as an RFID tag, an ID tag, an IC tag, an IC chip, an RF tag, a wireless tag, an electronic tag, or a wireless chip depending on the usage.

First, an example of a top-surface structure of a semiconductor device shown in this embodiment mode is explained with reference to FIG. 12A. A semiconductor device 80 shown in FIG. 12A includes a thin film integrated circuit 131 provided with a plurality of elements included in a memory portion and a logic portion, and a conductive film 132 functioning as an antenna. The conductive film 132 functioning as an antenna is electrically connected to the thin film integrated circuit 131. Although this embodiment mode shows an example in which the conductive film 132 functioning as an antenna is provided in a coil-like shape and an electromagnetic induction method or an electromagnetic coupling method is applied, the semiconductor device of the present invention is not limited to this, and a microwave method can also be applied. In a case of a microwave method, the shape of the conductive film 132 functioning as an antenna may be appropriately determined depending on the wavelength of an electromagnetic wave to be used.

Figure 12A:
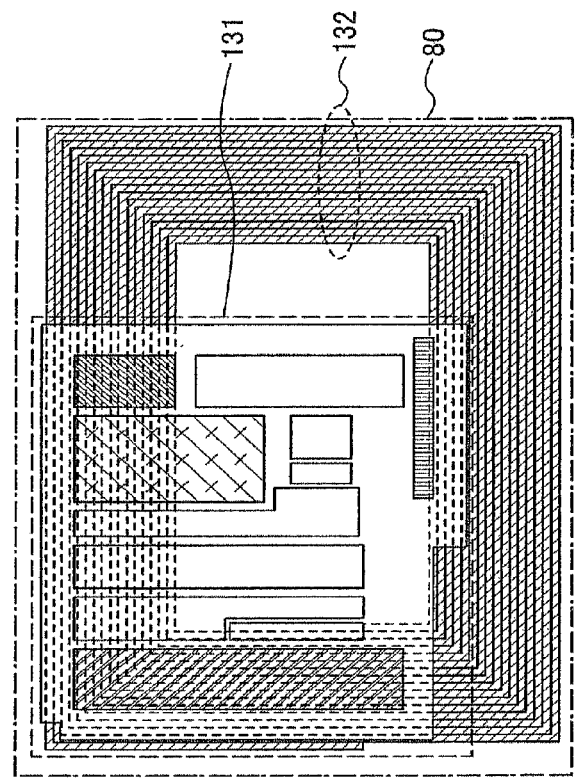
FIGS. 12A and 12B show an example of a nonvolatile semiconductor storage device of the present invention.
Figure 12B:
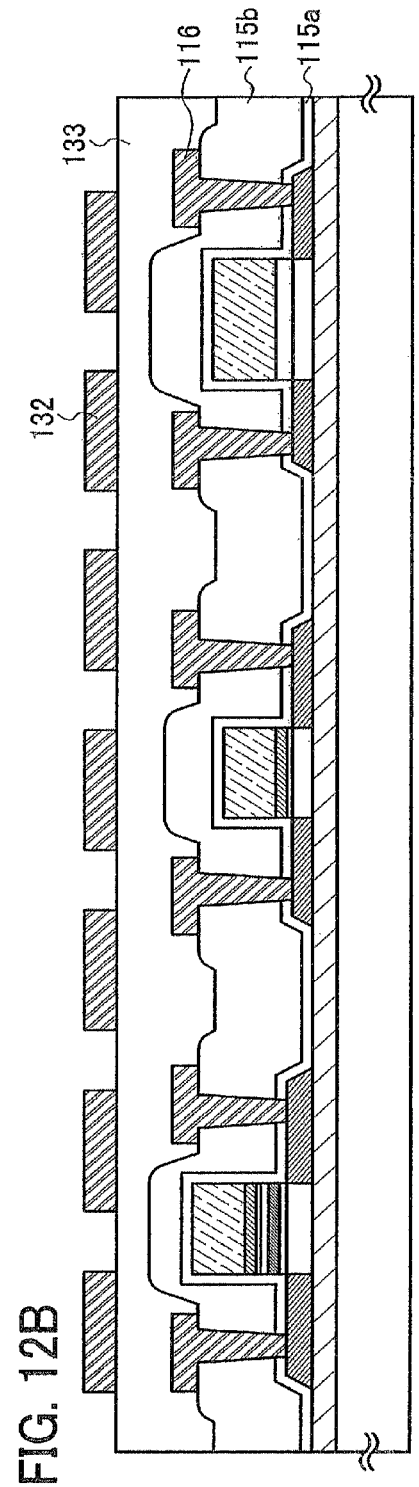

FIG. 12B is a schematic view of a cross section of FIG. 12A. The conductive film 132 functioning as an antenna may be provided over the elements included in the memory portion and the logic portion; for example, the conductive film 132 functioning as an antenna can be provided over the insulating film 115b with the insulating film 133 interposed therebetween in the structure shown in the above embodiment mode.

Next, an operation of the semiconductor device shown in this embodiment mode is explained.

Figure 13A:
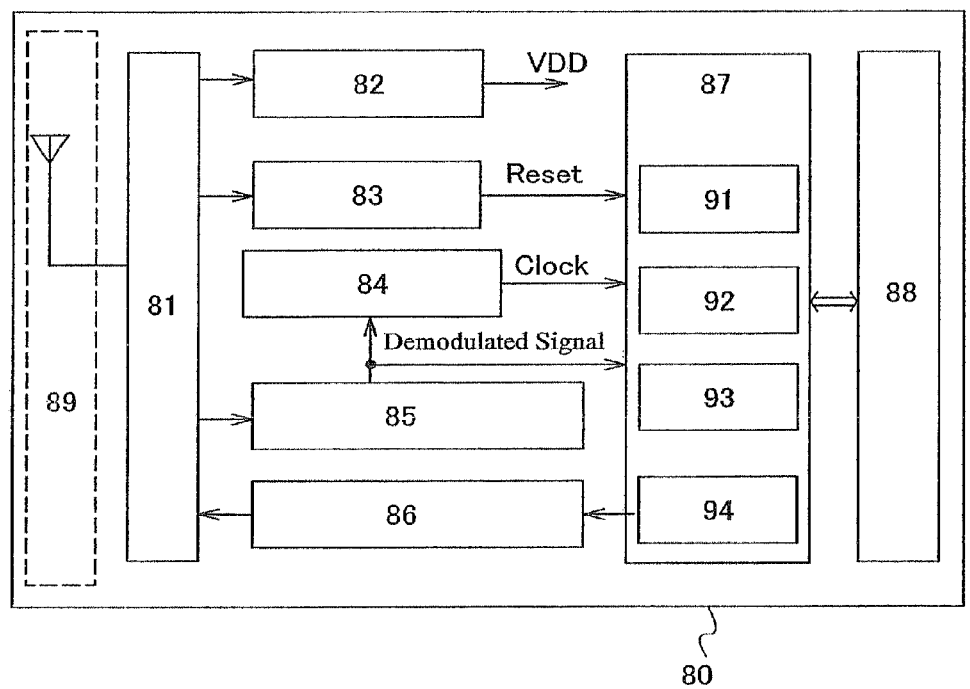
FIGS. 13A to 13C show examples of usage of a nonvolatile semiconductor storage device of the present invention.

The semiconductor device 80 has a function of exchanging data without contact, and includes a high-frequency circuit 81, a power source circuit 82, a reset circuit 83, a clock generating circuit 84, a data demodulating circuit 85, a data modulating circuit 86, a controlling circuit 87 for controlling another circuit, a storage circuit 88, and an antenna 89 (FIG. 13A). The high-frequency circuit 81 receives a signal from the antenna 89 and outputs a signal, which is received from the data modulating circuit 86, from the antenna 89. The power source circuit 82 generates a power source potential from a received signal. The reset circuit 83 generates a reset signal. The clock generating circuit 84 generates various clock signals based on a received signal inputted from the antenna 89. The data demodulating circuit 85 demodulates a received signal and outputs the demodulated signal to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. It is to be noted that the code extracting circuit 91 extracts each of plural codes included in an instruction sent to the controlling circuit 87. The code judging circuit 92 judges the content of the instruction by comparing the extracted code with a code corresponding to a reference. The CRC judging circuit 93 detects whether or not there is a transmission error or the like based on the judged code.

Subsequently, an example of an operation of the aforementioned semiconductor device is explained. First, a wireless signal is received by the antenna 89 and then sent to the power source circuit 82 through the high-frequency circuit 81, thereby generating a high power source potential (hereinafter referred to as VDD). The VDD is supplied to each circuit in the semiconductor device 80. A signal sent to the data demodulating circuit 85 through the high-frequency circuit 81 is demodulated (hereinafter this signal is called a demodulated signal). Moreover, signals passed through the reset circuit 83 and the clock generating circuit 84 via the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, the information of the semiconductor device stored in the storage circuit 88 is outputted. The outputted information of the semiconductor device is encoded through the output unit circuit 94. Further, the encoded information of the semiconductor device 80 passes through the data modulating circuit 86 and then is sent by the antenna 89 as a wireless signal. It is to be noted that a low power source potential (hereinafter called VSS) is common in the plural circuits included in the semiconductor device 80 and VSS can be GND.

In this manner, when a signal is sent from a reader/writer to the semiconductor device 80 and the signal sent from the semiconductor device 80 is received by the reader/writer, the data in the semiconductor device can be read.

Moreover, in the semiconductor device 80, power source voltage may be supplied to each circuit by electromagnetic waves without mounting a power source (battery), or a power source (battery) may be mounted so that power supply voltage is supplied to each circuit by both electromagnetic waves and the power source (battery).

Figure 13B:
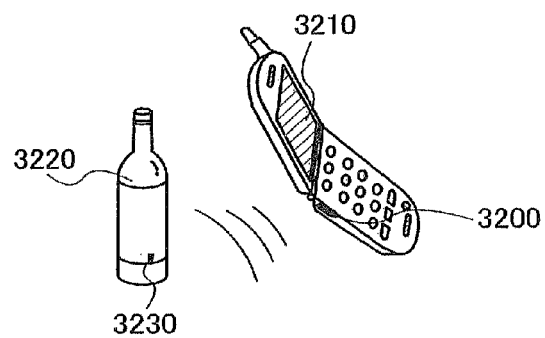
Figure 13C:
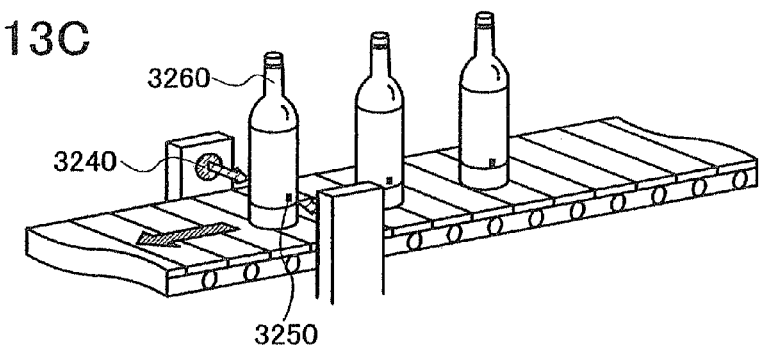
Figure 14A:
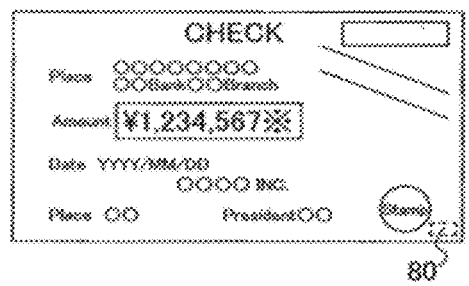
FIGS. 14A to 14H show examples of usage of a nonvolatile semiconductor storage device of the present invention.
Figure 14B:
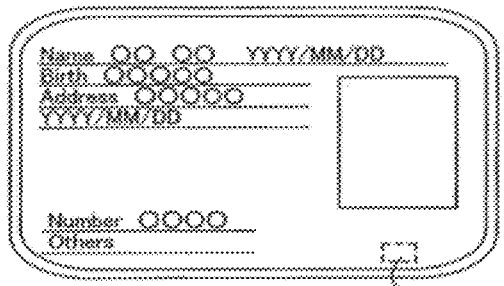
Figure 14C:
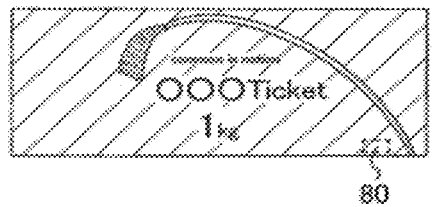
Figure 14D:
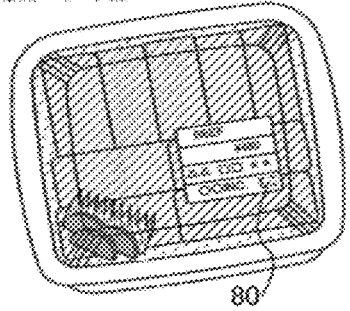
Figure 14E:
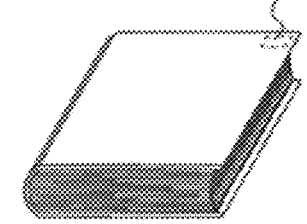
Figure 14F:
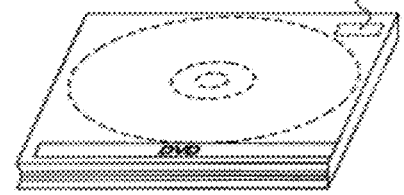
Figure 14G:
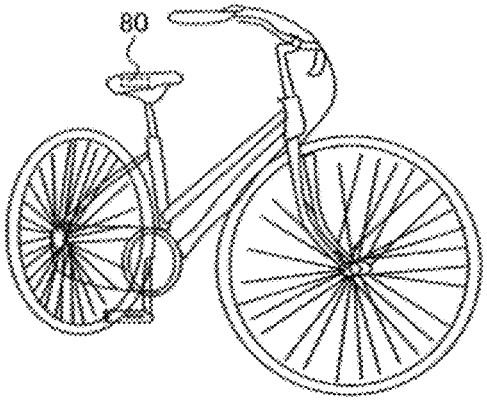
Figure 14H:

Next, an example of usage of a semiconductor device in which data can be inputted/outputted without contact is explained. A side surface of a mobile terminal including a display portion 3210 is provided with a reader/writer 3200. A side surface of a product 3220 is provided with a semiconductor device 3230 (FIG. 13B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected by using a semiconductor device 3250 provided to the product 3260 and a reader/writer 3240 (FIG. 13C). In this manner, by using the semiconductor device in the system, information can be obtained easily and higher performance and higher value addition are achieved.

In addition to the above, the semiconductor device provided with the nonvolatile semiconductor storage device of the present invention can be applied in a wide range. The semiconductor device can be applied to any product in which the information such as history of an object can be clarified without contact effectively for production, management, and so on. For example, the semiconductor device of the present invention can be provided and used for bills, coins, securities, certificates, bearer bonds, containers for wrapping, books, storage media, personal belongings, vehicles, groceries, garments, health products, daily commodities, medicines, electronic appliances, and the like. Examples of these are explained with reference to FIGS. 14A to 14H.

The bills and coins are money that circulates in the market, and include one that can be used in the same way as money in a specific area (such as cash voucher), a commemorative coin, and the like. The securities indicate a check, certificate, a promissory note, and the like (see FIG. 14A). The certificates indicate a driver's license, a resident's card, and the like (see FIG. 14B). The bearer bonds indicate a stamp, a rice coupon, various gift coupons, and the like (see FIG. 14C). The containers for wrapping indicate a wrapper for a packaged lunch and the like, a plastic bottle, and the like (see FIG. 14D). The books indicate a paperback book, a hardback book, and the like (see FIG. 14E). The storage media indicate DVD software, a video tape, and the like (see FIG. 14F). The vehicles indicate a wheeled vehicle such as a bicycle, a ship, and the like (see FIG. 14G). The personal belongings indicate a bag, glasses, and the like (see FIG. 14H). The groceries indicate foods, beverages, and the like. The garments indicate clothes, shoes, and the like. The health products indicate a medical apparatus, a health appliance, and the like. The daily commodities indicate furniture, a lighting apparatus, and the like. The medicines indicate a drug, an agricultural chemical, and the like. The electronic appliances indicate a liquid crystal display device, an EL display device, a television device (television receiver or thin television receiver), a cellular phone, and the like.

By providing the semiconductor device 80 for bills, coins, securities, certificates, bearer bonds, and the like, falsification thereof can be prevented. In addition, by providing the semiconductor device 80 to containers for wrapping, books, storage media, personal belongings, groceries, daily commodities, electronic appliances, and the like, efficiency of an inspection system, a system of a rental store, and the like can be improved. By providing the semiconductor device 80 for vehicles, health products, medicines, and the like, falsification and theft thereof can be prevented, and accidental ingestion of a drug can be prevented in the case of the medicines. The semiconductor device 80 can be provided by being attached to a surface of an article or being implanted in an article. For example, the semiconductor device can be implanted in paper in the case of a book, and can be implanted in an organic resin in the case of a package formed of the organic resin.

By providing the semiconductor devices to containers for wrapping, books, storage media, personal belongings, groceries, clothes, daily commodities, electronic appliances, and the like, an inspection system and a system of a rental store, and the like can be made efficient. By providing the semiconductor devices to vehicles, falsification and theft thereof can be prevented. By implanting the semiconductor devices in creatures such as animals, identification of the individual creature can be easily carried out. For example, by implanting the semiconductor device equipped with a sensor in a creature such as livestock, it is possible to easily know not only a year of birth, sex, kind and the like but also a health condition such as current temperature.

As thus described, the semiconductor device of the present invention can be applied in quite a wide range, and can be applied to electronic appliances of every field. This embodiment mode can be freely combined with any of the above embodiment modes.

This application is based on Japanese Patent Application serial no. 2006-034543 filed in Japan Patent Office on Feb. 10 in 2006, the entire contents of which are hereby incorporated by reference.

What is claimed is:
1. A method for manufacturing a nonvolatile semiconductor storage device, comprising:
   forming a first semiconductor film and a second semiconductor film, over a substrate having an insulating surface;
   forming a first insulating film on a surface of the first semiconductor film and a surface of the second semiconductor film, comprising:
      an oxide film formed by performing first high-density plasma treatment under an oxygen atmosphere; and
      a film including oxygen and nitrogen formed on the oxide film, formed by performing second high-density plasma treatment under a nitrogen atmosphere;
   forming a charge accumulating layer comprising a material with a smaller energy gap than the first semiconductor film and the second semiconductor film over the first insulating film;
   forming a second insulating film over the charge accumulating layer;
   removing selectively the first insulating film, the charge accumulating layer, and the second insulating film which are formed over the second semiconductor film so as to expose the surface of the second semiconductor film;
   oxidizing a surface of the second insulating film by performing third high-density plasma treatment under an oxygen atmosphere;
   forming a conductive film over the oxidized surface of the second insulating film;
   removing selectively the first insulating film, the charge accumulating layer, the second insulating film, and the conductive film, thereby leaving parts of the first insulating film, the charge accumulating layer, the second insulating film, and the conductive film so as to overlap with at least a part of the first semiconductor film; and
   forming an impurity region in the first semiconductor film and the second semiconductor film, by introducing an impurity element, with the parts of the conductive film, formed over the first semiconductor film and the second semiconductor film, used as a mask, respectively.

2. The method for manufacturing a nonvolatile semiconductor storage device according to claim 1, wherein the first high-density plasma treatment and the second high-density plasma treatment are performed continuously without the first semiconductor film and the second semiconductor film exposed to the air.

3. The method for manufacturing a nonvolatile semiconductor storage device according to claim 1, wherein the second insulating film includes nitrogen.

4. The method for manufacturing a nonvolatile semiconductor storage device according to claim 1, wherein the charge accumulating layer and the second insulating film are formed continuously without exposure to the air.

5. The method for manufacturing a nonvolatile semiconductor storage device according to claim 1, wherein the charge accumulating layer includes germanium.

6. The method for manufacturing a nonvolatile semiconductor storage device according to claim 1, wherein the conductive film includes nitrogen.

7. The method for manufacturing a nonvolatile semiconductor storage device according to claim 1, wherein the high-density plasma treatment is plasma treatment performed under conditions where high frequency is used, electron density ranges from $1 \times 10^{11}$ cm$^{-3}$ to $1 \times 10^{13}$ cm$^{-3}$, and electron temperature ranges from 0.5 eV to 1.5 eV.

8. The method for manufacturing a nonvolatile semiconductor storage device according to claim 7, wherein the high frequency is a microwave.

9. A method for manufacturing a nonvolatile semiconductor storage device, comprising:
- forming a first semiconductor film and a second semiconductor film, over a substrate having an insulating surface;
- forming a first insulating film on a surface of the first semiconductor film and a surface of the second semiconductor film, by performing first high-density plasma treatment under an oxygen atmosphere and then performing second high-density plasma treatment under a nitrogen atmosphere;
- forming a charge accumulating layer comprising a material with a smaller energy gap than the first semiconductor film and the second semiconductor film over the first insulating film;
- forming a second insulating film over the charge accumulating layer;
- removing selectively the first insulating film, the charge accumulating layer, and the second insulating film which are formed over the second semiconductor film so as to expose the surface of the second semiconductor film;
- oxidizing a surface of the second insulating film formed over the first semiconductor film and simultaneously forming a gate insulating film on the surface of the second semiconductor film, by performing third high-density plasma treatment under an oxygen atmosphere;
- forming a conductive film over the oxidized surface of the second insulating film and over the gate insulating film;
- removing selectively the first insulating film, the charge accumulating layer, the second insulating film, the gate insulating film, and the conductive film, thereby leaving parts of the first insulating film, the charge accumulating layer, the second insulating film, and the conductive film so as to overlap with at least a part of the first semiconductor film and leaving parts of the gate insulating film and the conductive film so as to overlap with at least a part of the second semiconductor film; and
- forming an impurity region in the first semiconductor film and the second semiconductor film by introducing an impurity element with the parts of the conductive film, formed over the first semiconductor film and the second semiconductor film, used as a mask, respectively.

10. The method for manufacturing a nonvolatile semiconductor storage device according to claim 9,
wherein the first high-density plasma treatment and the second high-density plasma treatment are performed continuously without the first semiconductor film and the second semiconductor film exposed to the air.

11. The method for manufacturing a nonvolatile semiconductor storage device according to claim 9, wherein the second insulating film includes nitrogen.

12. The method for manufacturing, a nonvolatile semiconductor storage device according to claim 9,
wherein the charge accumulating layer and the second insulating film are formed continuously without exposure to the air.

13. The method for manufacturing a nonvolatile semiconductor storage device according to claim 9, wherein the charge accumulating layer includes germanium.

14. The method for manufacturing a nonvolatile semiconductor storage device according to claim 9, wherein the conductive film includes nitrogen.

15. The method for manufacturing a nonvolatile semiconductor storage device according to claim 9, wherein the high-density plasma treatment is plasma treatment performed under conditions where high frequency is used, electron density ranges from $1\times10^{11}$ cm$^{-3}$ to $1\times10^{13}$ cm$^{-3}$, and electron temperature ranges from 0.5 eV to 1.5 eV.

16. The method for manufacturing a nonvolatile semiconductor storage device according to claim 15, wherein the high frequency is a microwave.

* * * * *